( 12 ) United States Patent
Huang et al.

(10) Patent No.: US 11,137,694 B2
(45) Date of Patent: Oct. 5, 2021

(54) PARTICLE SUPPRESSION SYSTEMS AND METHODS

(71) Applicants: ASML NETHERLANDS B.V., Veldhoven (NL); ASML HOLDING N.V., Veldhoven (NL)

(72) Inventors: Yang-Shan Huang, Veldhoven (NL); Marcel Joseph Louis Boonen, Dommelen (NL); Han-Kwang Nienhuys, Utrecht (NL); Jacob Brinkert, Schalkhaar (NL); Richard Joseph Bruls, Eindhoven (NL); Peter Conrad Kochersperger, Easton, CT (US)

(73) Assignees: ASML Netherlands B.V., Veldhoven (NL); ASML Holding N V., Veldhoven (NL)

(*) Notice: Subject to any disclaimer, the term of this patent is extended or adjusted under 35 U.S.C. 154(b) by 0 days.

(21) Appl. No.: 16/629,337

(22) PCT Filed: Jul. 18, 2018

(86) PCT No.: PCT/EP2018/069476
§ 371 (c)(1),
(2) Date: Jan. 8, 2020

(87) PCT Pub. No.: WO2019/020450
PCT Pub. Date: Jan. 31, 2019

(65) Prior Publication Data
US 2021/0173315 A1 Jun. 10, 2021

Related U.S. Application Data
(60) Provisional application No. 62/538,191, filed on Jul. 28, 2017.

(51) Int. Cl.
G03F 7/20 (2006.01)

(52) U.S. Cl.
CPC ...... *G03F 7/70916* (2013.01); *G03F 7/70866* (2013.01); *G03F 7/70933* (2013.01)

(58) Field of Classification Search
CPC ............ G03F 7/70933; G03F 7/70808; G03F 7/70341; G03F 7/70916; G03F 7/70866
(Continued)

(56) References Cited

U.S. PATENT DOCUMENTS 6,445,440 B1  9/2002  Bisschops et al.
6,731,371 B1  5/2004  Shiraishi
(Continued)

FOREIGN PATENT DOCUMENTS

JP  2007189073  7/2007
WO  2019020443  1/2019

OTHER PUBLICATIONS

U.S. Office Action issued in corresponding U.S. Appl. No. 16/629,349, dated May 18, 2020.
(Continued)

*Primary Examiner* — Hung Nguyen
(74) *Attorney, Agent, or Firm* — Pillsbury Winthrop Shaw Pittman LLP

(57) ABSTRACT

A lithographic apparatus that includes an illumination system that conditions a radiation beam, a first stationary plate having a first surface, and a reticle stage defining, along with the first stationary plate, a first chamber. The reticle stage supports a reticle in the first chamber, and the reticle stage includes a first surface spaced apart from a second surface of the first stationary plate, thereby defining a first gap configured to suppress an amount of contamination passing from a second chamber to the first chamber. The first stationary plate is between the reticle stage and both the illumination
(Continued)

system and a projection system configured to project a pattern imparted to the radiation beam by the patterning device onto a substrate.

27 Claims, 18 Drawing Sheets

(58) Field of Classification Search
USPC .................................................. 355/30, 53
See application file for complete search history.

(56) References Cited

U.S. PATENT DOCUMENTS

| | | | | |
|---|---|---|---|---|
| 7,745,079 | B2* | 6/2010 | Coon | G03F 7/70933 430/30 |
| 2005/0069433 | A1* | 3/2005 | Hayashi | G03F 7/70808 417/423.4 |
| 2005/0206860 | A1 | 9/2005 | Hof et al. | |
| 2005/0275835 | A1 | 12/2005 | Sogard | |
| 2006/0215137 | A1* | 9/2006 | Hasegawa | G03F 7/70933 355/53 |
| 2007/0079525 | A1* | 4/2007 | Sogard | G03F 1/82 34/275 |
| 2007/0209226 | A1 | 9/2007 | Coon | |
| 2007/0285632 | A1* | 12/2007 | Phillips | G03B 27/42 355/30 |
| 2009/0059190 | A1 | 3/2009 | Tanaka et al. | |
| 2012/0249983 | A1 | 10/2012 | Vogel et al. | |
| 2014/0085618 | A1 | 3/2014 | Delgado et al. | |

OTHER PUBLICATIONS

International Search Report and Written Opinion issued in corresponding PCT Patent Application No. PCT/EP2018/069459, dated Nov. 7, 2018.

International Search Report and Written Opinion issued in corresponding PCT Patent Application No. PCT/EP2018/069476, dated Nov. 15, 2018.

U.S. Final Office Action issued in corresponding U.S. Appl. No. 16/629,349, dated Aug. 18, 2020.

\* cited by examiner

PARTICLE SUPPRESSION SYSTEMS AND METHODS

CROSS-REFERENCE TO RELATED APPLICATIONS

This application claims priority of U.S. Provisional Patent Application No. 62/538,191, which was filed on Jul. 28, 2017, and which is incorporated herein in its entirety by reference.

FIELD

The present disclosure relates to particle suppression using, for example, particle traps and particle barriers in, for example, lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. The patterning device can be held in a vacuum environment. Within this vacuum environment, there can be contaminant particle sources, for example, cables or cable and hose carrier, which can generate contaminant particles. If these contaminant particles reach the patterning device and/or regions near the patterning device, defects in the formed image may occur.

SUMMARY OF THE DISCLOSURE

In some embodiments, a lithographic apparatus includes an illumination system configured to condition a radiation beam, and a first stationary plate defining a first opening and having a first surface. The lithographic apparatus also includes a reticle stage defining, along with the first stationary plate, a first chamber. The reticle stage is configured to support a reticle in the first chamber. The reticle stage has a first surface spaced apart from a second surface of the first stationary plate, thereby defining a first gap between a second chamber and the first chamber. The first gap is configured to suppress the amount of contamination passing from the second chamber to the first chamber. The lithographic apparatus also includes a projection system configured to project a pattern imparted to the radiation beam by the patterning device onto a substrate. And the first stationary plate is between the reticle stage and both the illumination system and the projection system.

In some embodiments, a lithographic apparatus includes a radiation source configured to emit extreme ultraviolet (EUV) radiation, and an illumination system configured to condition the EUV radiation. The lithographic apparatus also includes a first stationary plate defining a first opening and having a first surface. The lithographic apparatus also includes a reticle stage defining, along with the first stationary plate, a first chamber. The reticle stage is configured to support a reticle in the first chamber. The reticle stage includes a first surface spaced apart from a second surface of the first stationary plate, thereby defining a first gap between a second chamber and the first chamber. The first gap is configured to suppress the amount of contamination passing from the second chamber to the first chamber. The lithographic apparatus also includes a first gas inlet configured to inject gas into the first chamber. And lithographic apparatus includes a projection system configured to project a pattern imparted to the radiation beam by the patterning device onto a substrate. The first stationary plate is between the reticle stage and both the illumination system and the projection system.

In some embodiments, the lithographic apparatus also includes an encapsulating structure extending between the first stationary plate and both the illumination system and the projection system. The encapsulating structure encapsulates a path of the EUV radiation from the illumination system, to the reticle, and then to the projection system. The encapsulating structure includes a second gas inlet configured to inject gas into a volume defined by the encapsulating structure, and a gas exhaust between the gas inlet and the first stationary plate that is configured to remove gas from the volume defined by the encapsulating structure. The first gas inlet, the second gas inlet, and the gas exhaust are collectively configured to generate a first region between the first stationary plate and the gas exhaust comprising gas flowing toward the gas exhaust, thereby suppressing the amount of contamination passing from the first region to the first chamber. The first gas inlet, the second gas inlet, and the gas exhaust are collectively configured to generate a second region between the gas exhaust and the second gas inlet having gas flowing toward the gas exhaust, thereby suppressing the amount of contamination passing from the first chamber to the illumination system and the projection system. And the first gas inlet, the second gas inlet, and the gas exhaust are collectively configured to generate a third region between the second gas inlet and both the illumination system and the projection system. The third region includes gas flowing toward the illumination system and the projection system, thereby suppressing the amount of contamination passing from the illumination system and the projection system to the third region.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the invention.

Figure 1A:
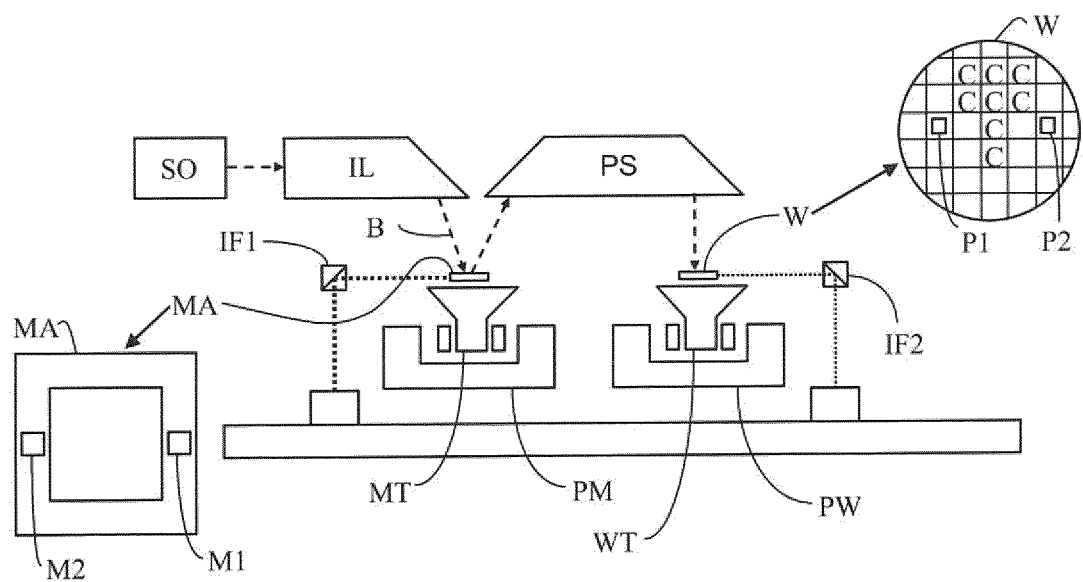
FIG. 1A is a schematic illustration of a reflective lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," "exemplary," "example," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present disclosure may be implemented.

Exemplary Reflective and Transmissive Lithographic Systems

Figure 1B:
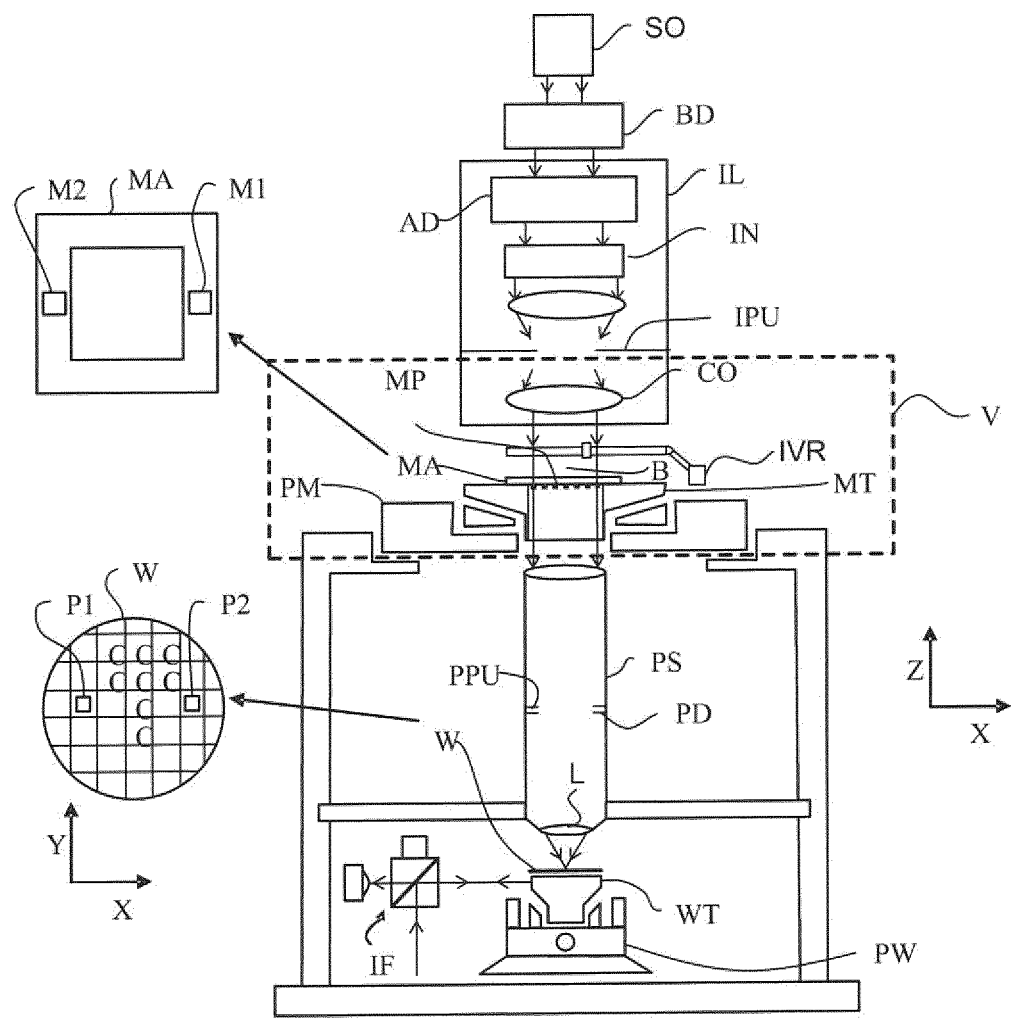
FIG. 1B is a schematic illustration of a transmissive lithographic apparatus according to an embodiment of the disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a reticle stage or a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. TA, the radiation beam B is incident on the patterning device (for example, mask) MA, which is held on the support structure (for example, a reticle stage or mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, a reticle stage or mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the reticle stage or mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the reticle stage or mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Reticle stage or mask table MT and patterning device MA can be in a vacuum chamber, where an in-vacuum robot IVR can be used to move patterning devices such as a mask or a reticle in and out of vacuum chamber. Alternatively, when reticle stage or mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, reticle stage or mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, reticle stage or mask table) MT and the substrate table WT are scanned synchronously while a pattern imparted to the radiation beam B is projected onto a target portion C (i.e., a single dynamic exposure). The velocity and direction of the substrate table WT relative to the support structure (for example, reticle stage or mask table) MT can be determined by the (de-)magnification and image reversal characteristics of the projection system PS.

3. In another mode, the support structure (for example, reticle stage or mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
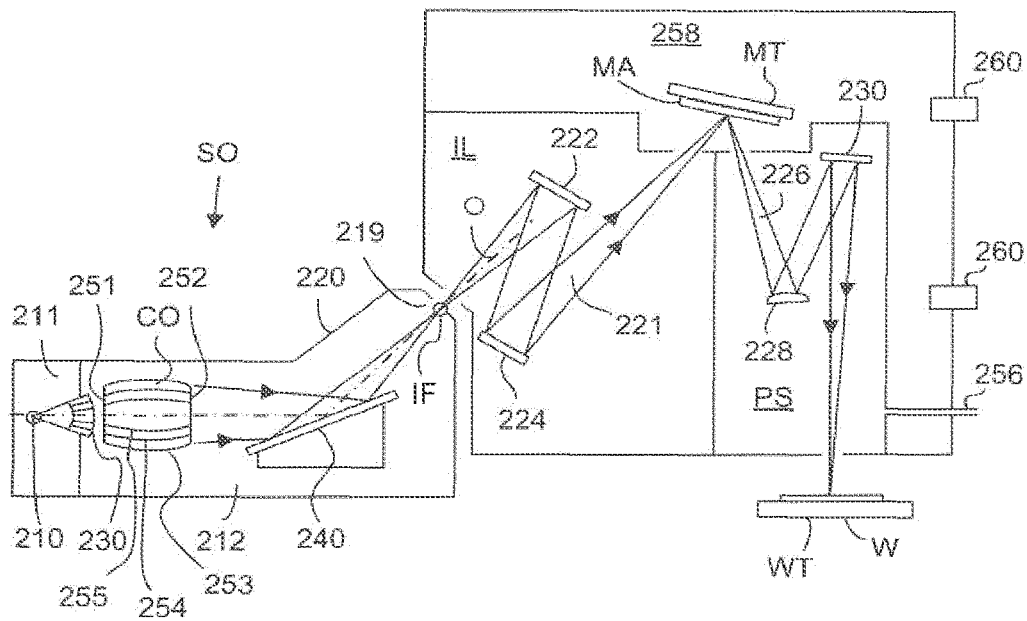
FIG. 2 is a more detailed schematic illustration of the reflective lithographic apparatus, according to an embodiment of the disclosure.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT. Support structure MT and patterning device MA can be contained in an environment 258 fluidly connect to one or more pumps 260 configured to create a vacuum pressure in environment 258.

More elements than shown may generally be present in illumination optics unit IL and projection system PS. The grating spectral filter 240 may optionally be present, depending upon the type of lithographic apparatus. Further, there may be more mirrors present than those shown in the FIGS., for example there may be 1-6 additional reflective elements present in the projection system PS than shown in FIG. 2. The housing(s) forming illumination optics unit IL and projection system PS can be fluidly coupled to one or more gas supplies 256 configured to inject gas therein to create a gas flow that protect the optical elements contained therein.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cells

Figure 3:
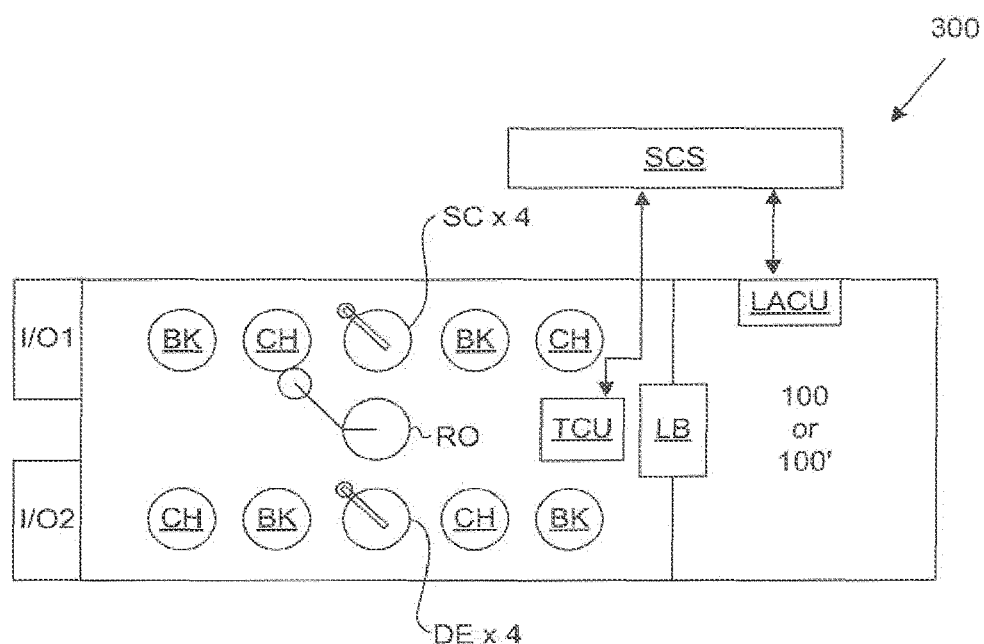
FIG. 3 is a schematic illustration of a lithographic cell, according to an embodiment of the disclosure.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Systems for Particle Suppression

The embodiments of this disclosure can be used with one or more apparatuses of FIGS. 1A, 1B, 2, and/or 3. For example, the embodiments of this disclosure can be applied to object stages, such as (a) reticle stage or mask table MT or (b) substrate table WT, that are configured to support an object, such as substrate W and patterning device MA.

Figure 4:
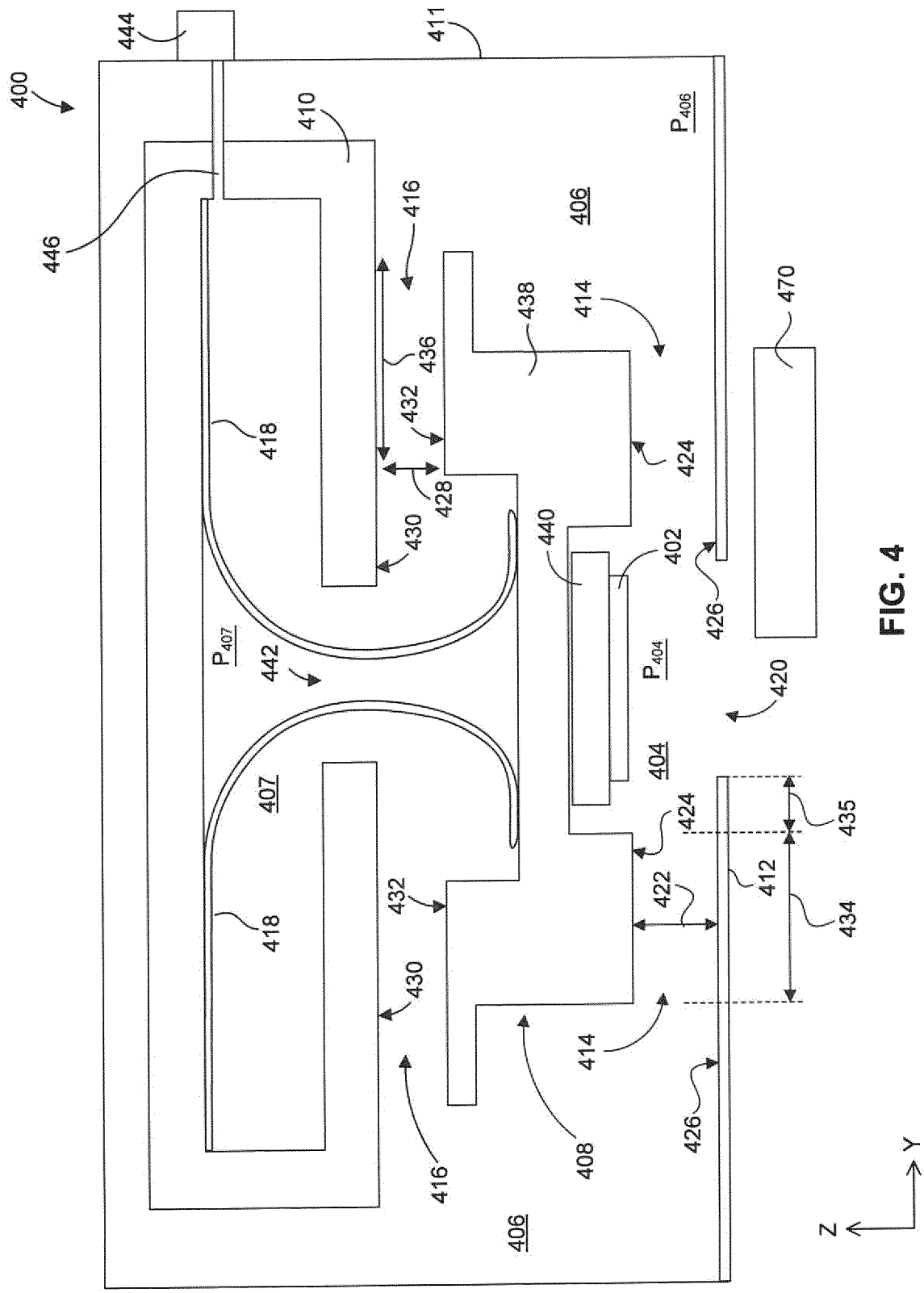
FIG. 4 schematically depicts a cross-section of a reticle stage, according to an embodiment.

FIG. 4 schematically depicts, in cross-section, one embodiment of a reticle stage 400. Reticle stage 400 is configured to support and move a patterning device 402, for example, a reticle. Although the below embodiments are discussed with respect to a reticle stage, the embodiments can be applied to other suitable components (e.g., substrate table WT, wafer stage, wafer handler, reticle handler, or other components sensitive to particle contamination) of a lithography apparatus (e.g., lithography apparatuses 100 and 100' as described in this disclosure), or other particle sensitive apparatus such as metrology systems, tubes, gas flow ducts, or boxes of gas ducts/pipes. The embodiments of this disclosure can also be applied to any particle sensitive apparatus to reduce the number of undesired contaminant particles.

Reticle stage 400 can be configured to suppress (i.e., eliminate or reduce) the amount of contamination particles reaching patterning device 402 and/or regions near patterning device 402 in a first chamber 404. Sources of contamination can be located, for example, in one or more of a second chamber 406 and a third chamber 407, which are described in more detail below. Or for example, sources of contamination can be located in illumination system IL or projection system PS (e.g., illumination system IL or projection system PS described above with reference to FIGS. 1A, 1B, and 2), which can be positioned, for example, below an opening 420 discussed further below.

As shown in FIG. 4, reticle stage 400 can include a first structure 408 and a second structure 410 that are movable relative to each other. In some embodiments, first structure 408 is movable, and second structure 410 is stationary. In some embodiments, first structure 408 is stationary, and second structure 410 is movable. And in some embodiments, both first and second structures 408 and 410 are movable or stationary as needed.

First and second structures 408 and 410 can be positioned within a housing 411. In some embodiments, second structure 410 is a separate component from housing 411 as shown in FIG. 4. In other embodiments (not shown), second structure 410 is part of housing 411. Housing 411 can define a volume held at a vacuum pressure—a pressure below the atmospheric pressure. Within housing 411, first structure 408 and a stationary plate 412 can at least partially define at least first chamber 404, and one or more of first structure 408 and second structure 410 can at least partially define at least second chamber 406 and third chamber 407. In some embodiments, second chamber 406 extends entirely around first structure 408.

In some embodiments, stationary plate 412 is part of housing 411 as shown in FIG. 4. In other embodiments (not shown), stationary plate 412 is a separate component positioned within housing 411.

In some embodiments, first structure 408 and second structure 410 are movably coupled relative to each other (e.g., using magnetic levitation) such that (a) a gap 414 is formed between first structure 408 and stationary plate 412, and (b) a gap 416 is formed between first structure 408 and second structure 410. In some embodiments, gap 414 extends between first chamber 404 and second chamber 406, and gap 416 extends between second chamber 406 and third chamber 407. In some embodiments, the boundary between first chamber 404 and second chamber 406 is defined by gap 414, and the boundary between second chamber 406 and third chamber 407 is defined by gap 416.

According to some embodiments, each of first chamber 404, second chamber 406, and third chamber 407 can be held at a vacuum pressure—a pressure below the atmospheric pressure. For example, the vacuum pressure can range from about 0.1 Pa to about 8.5 Pa. In some examples, the vacuum pressure can range from about 0.5 Pa to about 8.5 Pa. For example, the vacuum pressure can range from about 1.5 Pa to about 8.5 Pa. In some examples, the vacuum pressure can range from about 2 Pa to about 5 Pa. In some examples, the vacuum pressure can range from about 2 Pa to about 3 Pa. In some embodiments, the pressure $P_{404}$ in first chamber 404 can be similar to or different from the pressure $P_{406}$ in second chamber 406 and/or pressure $P_{407}$ in third chamber 407. For example, the pressure $P_{404}$ in first chamber 404 can be more than the pressure $P_{406}$ in second chamber 406, and the pressure $P_{406}$ in second chamber 406 can be more than pressure $P_{407}$ in third chamber 407. For example, the pressure $P_{407}$ in third chamber 407 can range from about 0.25 Pa to about 1 Pa, the pressure $P_{406}$ in second chamber 406 can range from about 2 Pa to about 3 Pa, and pressure $P_{404}$ in first chamber 404 can range from about 4.0 Pa to about 6.0 Pa.

In some embodiments, third chamber 407, first structure 408, and second structure 410 may include or house components that are sources of contaminant particle sources. For example, cable and hose carriers 418 (sometimes referred to as cable slabs) are positioned within third chamber 407. Cable and hose carriers 418 can be configured in a rolling loop configuration, and cable and hose carriers 418 can house electrical wires and/or fluid hoses (e.g., liquid and gas hoses) that electrically and/or fluidly couple second structure 410 to first structure 408. Cable and hose carriers 418 can have any suitable configuration for housing and/or supporting cables and/or hoses. The cable and hose carriers can be unsegment without mechanical hinges or segmented with mechanical hinges, in some embodiments. Cable and hose carriers 418 can be a source of contaminant particles. As first structure 408 moves to position patterning device 402, so too do cable and hose carriers 418. Movement of cable and hose carriers 418 may generate contamination particles that may travel from third chamber 407 to second chamber 406 via gap 416. And contamination particles in second chamber 406 may travel from second chamber 406 to first chamber 404 via gap 414.

In some embodiments, one or both of gap 414 and gap 416 can be configured to function as a seal that suppresses (i.e., eliminates or reduces) the amount of contamination particles reaching patterning device 402 and/or regions near patterning device 402 in first chamber 404 from second chamber 406 and third chamber 407. For example, gap 414 can have a height 422 (the distance between (a) a surface 424 of first structure 408 facing second stationary plate 412 and (b) a surface 426 of stationary plate 412 facing first structure 408) of about 2.0 mm or less. And for example, gap 416 can have a height 428 (the distance between (a) a surface 430 of second structure 410 facing first structure 408 and (b) a surface 432 of first structure 408 facing second structure 410) of about 2.0 mm or less. Contaminant particles moving through gaps 414 and 416 bounce between respective surfaces 424, 426, 430, and 432. This bouncing causes the particles to lose energy and velocity, which allows the particles to either stick to respective surfaces 424, 426, 430, and 432, or slow to a magnitude that allows the gas flow occurring through gaps 414 and 416 (e.g., due to pressure differences in the respective chambers 404, 406, and 408) to push the particles back toward respective chambers 406 and 407. Accordingly, gaps 414 and 416 function as a seal that eliminates or reduces the amount of contamination particles from second chamber 406 and third chamber 407 that reach second chamber 406 and first chamber 404 (e.g., patterning device 402 and/or regions near patterning device 402 in first chamber 404), respectively. Notably, for ease of illustration, gap height 422 and gap height 428 are not drawn to scale, and accordingly, the illustrated size of gap height 422 and gap height 428 relative to the other components of reticle stage 400 are not to scale.

In some embodiments, gap 414 is also configured to maintain a pressure difference between pressure $P_{404}$ of first chamber 404 and pressure $P_{406}$ of second chamber 406 that minimizes the flow of gas from chamber 404 to chamber 406. Accordingly, in some embodiments, gap height 422 is minimized and horizontal length 434 is maximized. For example, in some embodiments, gap height 422 ranges from about 2 mm to about 4 mm, and length 434 is about 100 mm.

In some embodiments, surface 424 of first structure 408 can be extended and/or projected inward (e.g., toward first chamber 404) or outward (e.g., away from first chamber 404) from first structure 408. The seal can extend entirely or partially around the periphery of first chamber 404 in some embodiments. The seal can have similar or different lengths along the scan direction (e.g., the Y axis) and along the direction transverse to the scan direction (e.g., the X-axis). In a non-limiting example, the seal can be longer along the scan direction (e.g., the Y axis) than along the direction transverse to the scan direction (e.g., the X-axis). In some embodiments, surface 432 of first structure 408 can be extended and/or projected inward (e.g., toward third chamber 407) or outward (e.g., away from third chamber 407) from first structure 408. This seal can extend entirely or partially around the periphery of third chamber 407 in some embodiments. The seal can have similar or different lengths along the scan direction (e.g., the Y axis) and along the direction transverse to the scan direction (e.g., the X-axis). In a non-limiting example, the seal can be longer along the scan direction (e.g., the Y axis) than along the direction transverse to the scan direction (e.g., the X-axis).

In some embodiments, gap 414 can have a length 434 of which surface 424 of first structure 408 is adjacent surface 426 of stationary plate 412. For example, length 434 of gap 414 can be about 50-350 mm. For example, length 434 of gap 414 can be about 70-320 mm. For example, length 434 of gap 414 can be about 75-315 mm. In some embodiments, gap 416 can have a length 436 of which surface 432 of first structure 408 is adjacent surface 430 of second structure 410. For example, length 436 of gap 416 can be about 50-350 mm. For example, length 436 of gap 416 can be about 70-320 mm. For example, length 436 of gap 416 can be about 75-315 mm. However, it is noted these are exemplary dimensions and the embodiments of this disclosure are not limited to these examples.

In some embodiments, a distance 435 in the scan direction (e.g., along the Y-axis in FIG. 4)—between (a) the inner boundary of surface 424 (i.e., the right end point of length 434 illustrated in FIG. 4) and (b) the outer perimeter of opening 420—is greater than one-half the range of motion of second structure 408 in the scan direction (e.g., along the Y-axis in FIG. 4). As such, seal length 434 formed by gap 414 is constant during normal operational motion of second structure 408 in the scan direction, which can help maintain the pressure difference between pressure $P_{404}$ of first chamber 404 and pressure $P_{406}$ of second chamber 406. For example, if the stroke of second structure 408 during normal operation is about +/−150 mm along the scan direction, distance 435 can be greater than about 150 mm.

In some embodiments, distance 435 in the scan direction (e.g., along the Y-axis in FIG. 4) is less than the range of motion of second structure 408 in the scan direction (e.g., along the Y-axis in FIG. 4). As such, seal length 434 formed by gap 414 will vary during normal operational motion of second structure 408 in the scan direction as a portion of surface 424 overlaps opening 420 in the Z-direction. For example, if the stroke of second structure 408 during normal operation is about +/−150 mm along the scan direction, distance 435 can be less than about 150 mm.

In some embodiments, first structure 408, second structure 410, and stationary plate 412 are each made of metal, for example, stainless steel, nickel coated aluminum, or any other suitable metal. In some embodiments, first structure 408, second structure 410, and stationary plate 412 are each made of any suitable plastic or other material. First structure 408 and second structure 410 can include same or different materials.

In some embodiments, patterning device 402 is mounted to first structure 408 such that first structure 408 can move patterning device 402 within first chamber 404. According to some embodiments, first structure 408 can move patterning device 402 in a scan direction (e.g., along the Y-axis in FIG. 4) and in a direction transverse to the scan direction (e.g., the X-axis in FIG. 4).

In some embodiments, first structure 408 includes a first part 438 and a second part 440 moveable relative to first part 438. Patterning device 402 can be mounted to second part 440 in some embodiments. In some embodiments, second part 426 can be a chuck configured to support and move patterning device 402.

According to some embodiments, second part 440 can be a short stroke module (fine positioning) of reticle stage 400 that supports patterning device 402. Second part 440 can be coupled to first part 438 such that second part 440 can move relative to first part 438, but also driven by first part 438. In a non-limiting example, second part 440 is coupled to the first part 438 by one or more actuators (not shown), such as motors, configured to move second part 440 relative to first part 438. In some embodiments, second part 440 can move in the scan direction (e.g., the Y-axis in FIG. 4) and in the direction transverse to the scan direction (e.g., the X-axis in FIG. 4). According to some embodiments, first part 438 can be a long stroke module (coarse positioning) of reticle stage 400 configured to move relative to first structure 408, thereby moving both second part 440 and patterning device 402. In some embodiments, first part 438 can move in the scan direction (e.g., the Y-axis in FIG. 4) and in the direction transverse to the scan direction (e.g., the X-axis in FIG. 4). According to some examples, second part 440 can move with respect to first part 438 over a small range of movements relative to the range of movement of first part 438 relative to second structure 410. Short stroke and long stroke modules are merely examples of parts 438 and 440, respectively, and other structures can be used as parts 438 and 440. Further, the movement of parts 438 and 440 discussed above are exemplary movements, and the embodiments of this disclosure can include other directions and movement ranges.

Again, third chamber 407 can be defined, at least in part, by stationary second structure 410 and movable first structure 408. As shown in FIG. 4, stationary second structure 410 can also define an opening 442 through which one or more cable and hose carriers 418 pass. According to some examples, at least one pump 444 configured to create negative pressure, such as a suction pump, a vacuum pump, etc., can be operationally coupled to third chamber 407 (for example, at an upper portion of second structure 410) to create the vacuum pressure in third chamber 407, second chamber 406, and first chamber 404. The flow created by pump 444 may also pull particles from third chamber 407. In some examples, pump 444 can be located outside housing 411 and is operationally coupled to third chamber 407 via conduit 446, as shown in FIG. 4. In some embodiments (not shown), pump 444 can be inside housing 411 and is operationally coupled to second chamber 406. According to some examples, cable and hose carriers 418 can include one or more hoses coupled to pump 444.

Although pump 444 is illustrated on a side of housing 411 away from opening 442, pump 430 can be positioned at other locations, for example, near opening 442 and/or near the source of particle contamination, in some embodiments. In some embodiments in which pump 444 is positioned near opening 442 and/or near the source of particle contamination, the velocity of the gas flow is maximized.

In some embodiments, stationary plate 412 defines opening 420 configured to allow radiation to pass from illumination system IL to patterning device 402 and back to projection system PS.

In some embodiments, opening 420 is configured (e.g., sized, shaped, and positioned) to allow a robotic reticle exchange device 470 to exchange one patterning device 402 mounted to second part 440 of first structure 408 with another patterning device 402. For example, the dimensions of opening 420 are greater than the dimensions of patterning device 402. In some embodiments, the dimensions of opening 420 are greater than 152 mm×152 mm along the Y-axis and the X-axis when patterning device 402 is about 152 mm×152 mm.

Particle contamination may travel from illumination system IL and projection system PS into first chamber 404 via opening 420. In some embodiments, reticle stage 400 can include one or more gas inlets configured to inject gas into or adjacent first chamber 404 to create a gas flow that suppresses particle contamination from illumination system IL and projection system PS into first chamber 404 via opening 420.

Figure 5:
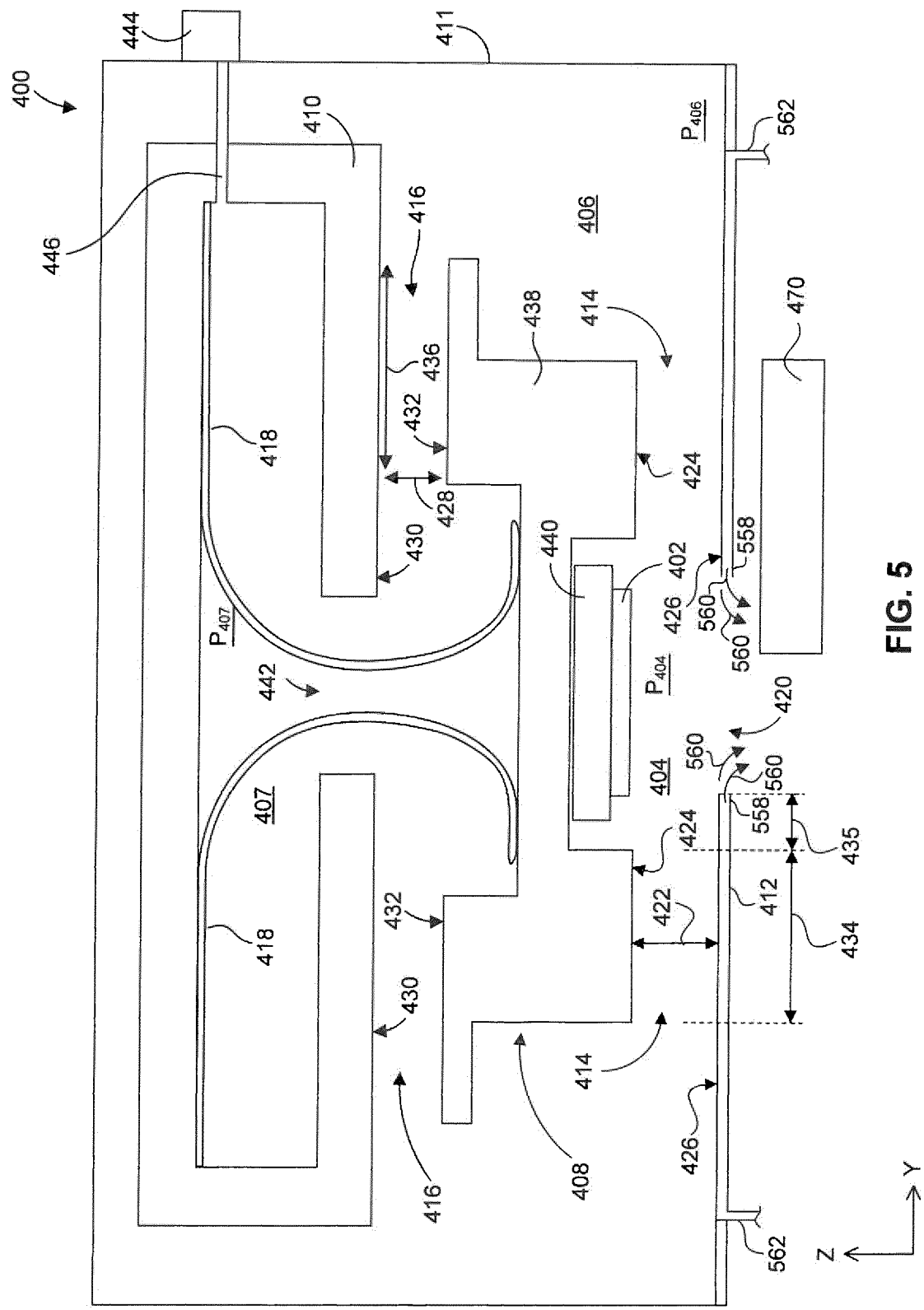
FIG. 5 schematically depicts a cross-section of a reticle stage having a gas inlet, according to an embodiment.

FIG. 5 illustrates one such embodiment having one or more gas inlets configured to inject gas into first chamber 404 to suppress molecular and particle contamination traveling from illumination system IL and projection system PS. As shown in FIG. 5, a plurality of gas inlets 558 are disposed on stationary plate 412. Gas inlets 558 are configure inject gas into first chamber 404 to create a gas flow 560 in a direction away from patterning device 402 through opening 420, and towards illumination system IL and projection system PS. Gas flow 560 can generate drag forces on particle contamination moving in a direction toward patterning device 402 through opening 420. This applied drag force from gas flow 560 can suppresses particle contamination that enters into first chamber 404 via opening 420.

Gas inlets 558 can be integrally formed by plate 412 in some embodiments, or gas inlets 558 can be separate components coupled to plate 412 in some embodiments. Gas inlets 558 can be simple openings in some embodiments as shown in FIG. 5, or nozzles in some embodiments (not shown).

In some embodiments, first structure 408 is configured (e.g., sized and shaped) such that the portions of first structure 408 defining gap 414 never overlap opening 420 and, thus, are not exposed to radiation during ordinary operation of reticle stage 400. For example, in some embodiments, the portions of first structure 408 defining gap 414 are positioned at the lateral sides of first structure 408.

Figure 6:
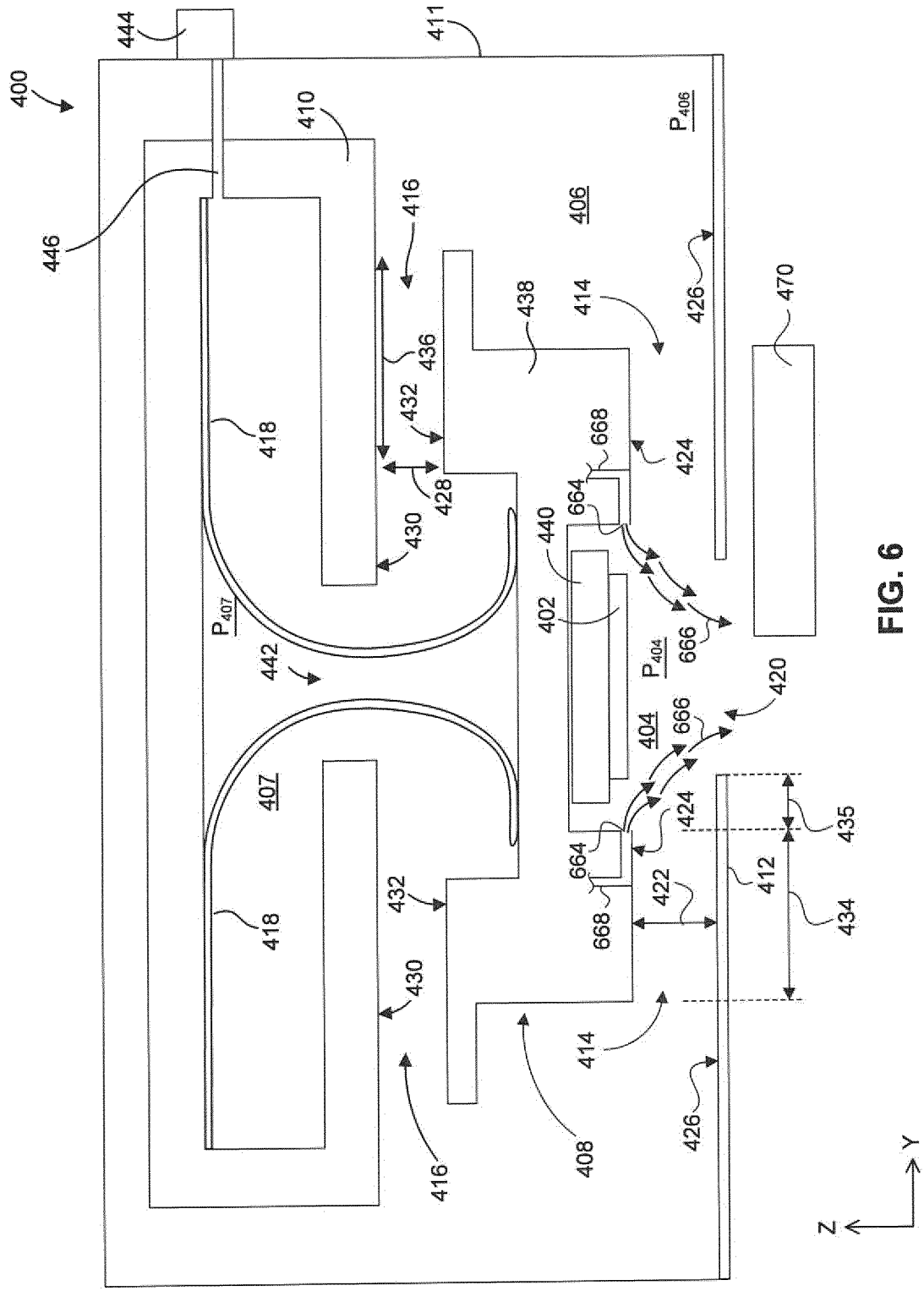
FIG. 6 schematically depicts a cross-section of a reticle stage having a gas inlet, according to another embodiment.

FIG. 6 illustrates another embodiment having one or more gas inlets configured to inject gas into first chamber 404 to suppress molecular and particle contamination traveling from illumination system IL and projection system PS. As shown in FIG. 6, a plurality of gas inlets 664 are disposed on first movable structure 408, specifically, on first part 438 of first structure 408. Gas inlets 664 are configure inject gas into first chamber 404 to create a gas flow 666 in a direction away from patterning device 402, through opening 420, and towards illumination system IL and projection system PS. Gas flow 666 can generate drag forces on molecular and particle contamination moving in a direction toward patterning device 402 through opening 420. These drag forces can suppress molecular and particle contamination from entering first chamber 404 via opening 420.

Gas inlets 664 can be integrally formed by first structure 408 in some embodiments, or gas inlets 664 can be separate components coupled to first structure 408 in some embodiments. Gas inlets 664 can be simple openings in some embodiments, or nozzles in some embodiments.

First structure 408 can also include one or more conduits 668 that fluidly connect gas inlets 664 to a gas supply. In some embodiments, conduits 668 are coupled to one or more fluid hoses in cable and hose carriers 418. Conduits 668 can be integrally formed by first structure 408 in some embodiments, or can be separate components coupled to first structure 408 in some embodiments.

In some embodiments (not shown), gas inlets configured to inject gas into first chamber 404 to suppress molecular and particle contamination traveling from illumination system IL and projection system PS can be disposed at locations other than plate 412 or first part 438 of movable structure 408.

Figure 7:
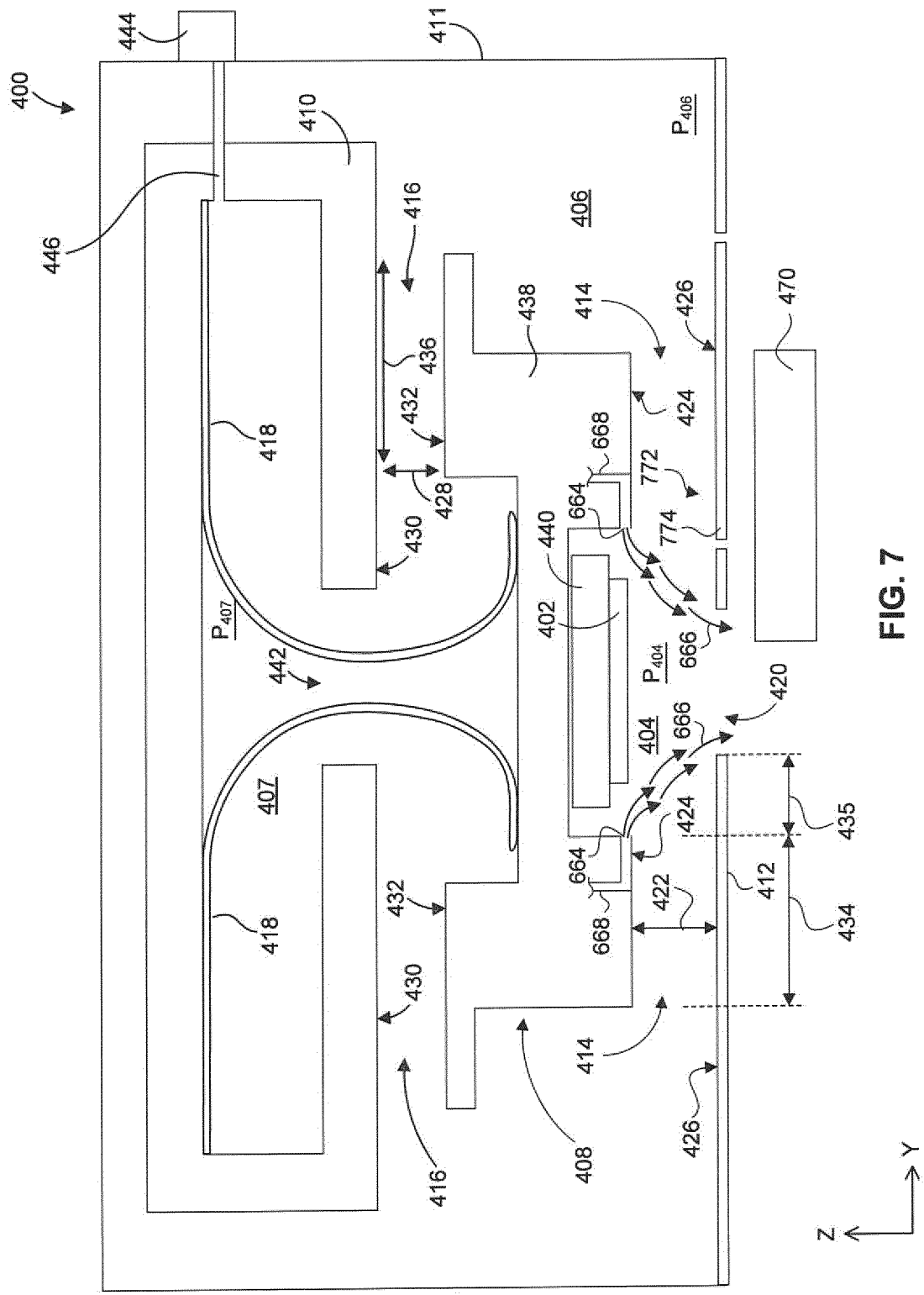
FIG. 7 schematically depicts a cross-section of a reticle stage, according to another embodiment.

In some embodiments, reticle exchange does not occur through the same opening 420 defined by stationary plate 412 through which radiation passes. Rather, as shown in FIG. 7, for example, stationary plate 412 can define another opening 772 configured (e.g., sized, shaped, and positioned) to allow robotic reticle exchange device 470 to exchange one patterning device 402 mounted to second part 440 of first structure 408 with another patterning device 402. The dimensions of opening 772 are greater than the dimensions of patterning device 402. For example, in some embodiments, the dimensions of opening 772 are greater than 152 mm×152 mm along the Y-axis and the X-axis when patterning device 402 is about 152 mm×152 mm.

Reticle stage 400 can also include a movable hatch 774 that covers opening 772 in some embodiments. But hatch 774 can be omitted in some embodiments. Hatch 774 can be flush with surface 426 of stationary plate 412 in some embodiments, or hatch 774 can be recessed from surface 426 of stationary plate 412 in some embodiments. Hatch 774 is movable between a first position in which opening 772 is covered (as shown in FIG. 7), and a second position in which opening 772 is uncovered (not shown), providing reticle exchange device access to second part 440 of first structure 408 (when aligned with opening 772) and to patterning device 402 coupled thereto.

Because reticle exchange does not occur through opening 420, the size of opening 420 can be reduced relative to embodiments in which reticle exchange occurs through opening 420, which in turn increases distance 435 between the inner boundary of surface 424 (i.e., the right end point of length 434 illustrated in FIG. 4) and the outer perimeter of opening 420. Thus, the space between stationary plate 412 and surface 424 of first structure 408 is mostly constant, regardless of the relative position between first structure 408 and opening 420.

Although hatch 774 is illustrated as a separate component from reticle exchange device 470 in FIG. 7, hatch 774 can be part of reticle exchange device 470 in some embodiments. For example, hatch 774 could be part of a robotic arm of reticle exchange device 470 acting as a "dummy reticle," while the other robotic arms of reticle exchange device 470 support other patterning devices 402.

Second opening 772 and hatch 774 can be incorporated into any of the disclosed embodiments.

Figure 12:
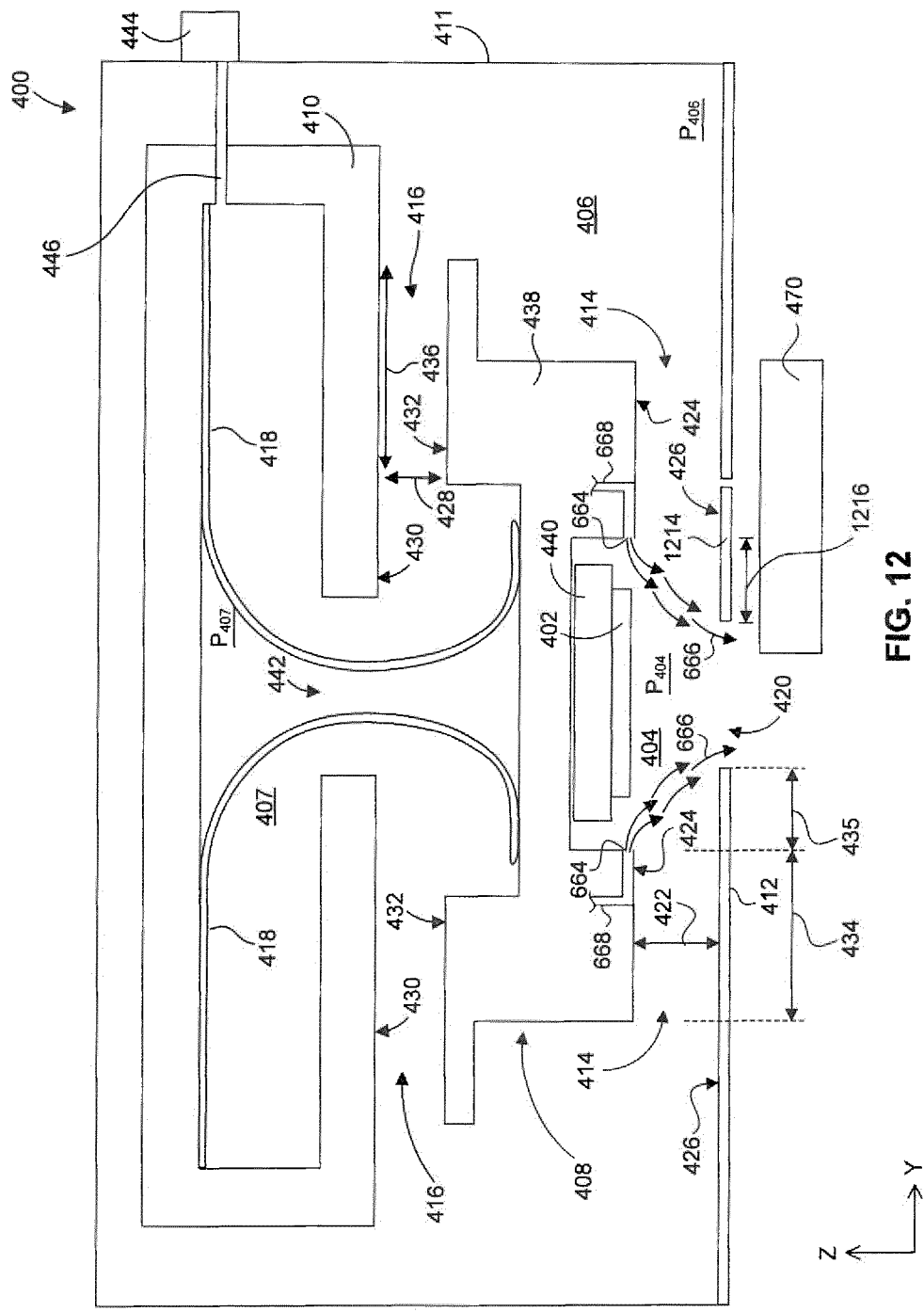
FIG. 12 schematically depicts a cross-section of a reticle stage, according to another embodiment.

FIG. 12 illustrates another embodiment having a hatch 1214. But unlike hatch 774 in the embodiment of FIG. 7 that covers a second opening defined by stationary plate 412, hatch 1214 covers a portion of opening 420. As shown in FIG. 12, the dimensions of opening 420 defined by stationary plate 412 are greater than the dimensions of patterning device 402. For example, in some embodiments in which patterning device 402 is about 152 mm×152 mm along the Y-axis and the X-axis, the dimensions of opening 420, itself, are greater than about 152 mm×152 mm along the Y-axis and the X-axis. But when movable hatch 1214 covers a portion of opening 420 as shown in FIG. 12, the dimensions of the effective opening are smaller than the dimensions of patterning device 402, for example, smaller than about 152 mm×152 mm.

Hatch 1214 can be flush with surface 426 of stationary plate 412 in some embodiments, or hatch 1214 can be recessed from surface 426 of stationary plate 412 in some embodiments. Hatch 1214 is movable between a first position in which a portion of opening 420 is covered (as shown in FIG. 12), and a second position in which opening 772 is fully or substantially uncovered (not shown), providing reticle exchange device 470 access to second part 440 of first structure 408 and to patterning device 402 coupled thereto.

In some embodiments, a distance 1216 in the scan direction (e.g., along the Y-axis in FIG. 12)—between the inner edge of surface 424 and the inner edge of hatch 1214 (i.e., the outer perimeter of the effective opening)—is greater than one-half the range of motion of second structure 408 in the scan direction (e.g., along the Y-axis in FIG. 12). As such, seal length 434 formed by gap 414 is constant during normal operational motion of second structure 408 in the scan direction. Such a configuration can help maintain the pressure difference between pressure $P_{404}$ of first chamber 404 and pressure $P_{406}$ of second chamber 406. For example, if the stroke of second structure 408 during normal operation is about +/−150 mm along the scan direction, distance 1216 can be greater than about 150 mm.

Again, particle contamination may travel from illumination system IL and projection system PS to first chamber 404 via opening 420. Molecular and particle contamination may travel from first chamber 404 toward illumination system IL and projection system PS via opening 420. In some embodiments, a lithographic apparatus 801 having reticle stage 400 can include one or more gas inlets configured to inject gas at a position between stationary plate 412 and both illumination system IL and projection system PS to create a plurality of gas flows configured to suppress molecular and particle contamination traveling from illumination system IL and projection system PS that enters first chamber 404 via opening 420, and configured to suppress molecular and particle contamination traveling from first chamber 404 that enters illumination system IL and projection system PS via opening 420.

Figure 8:
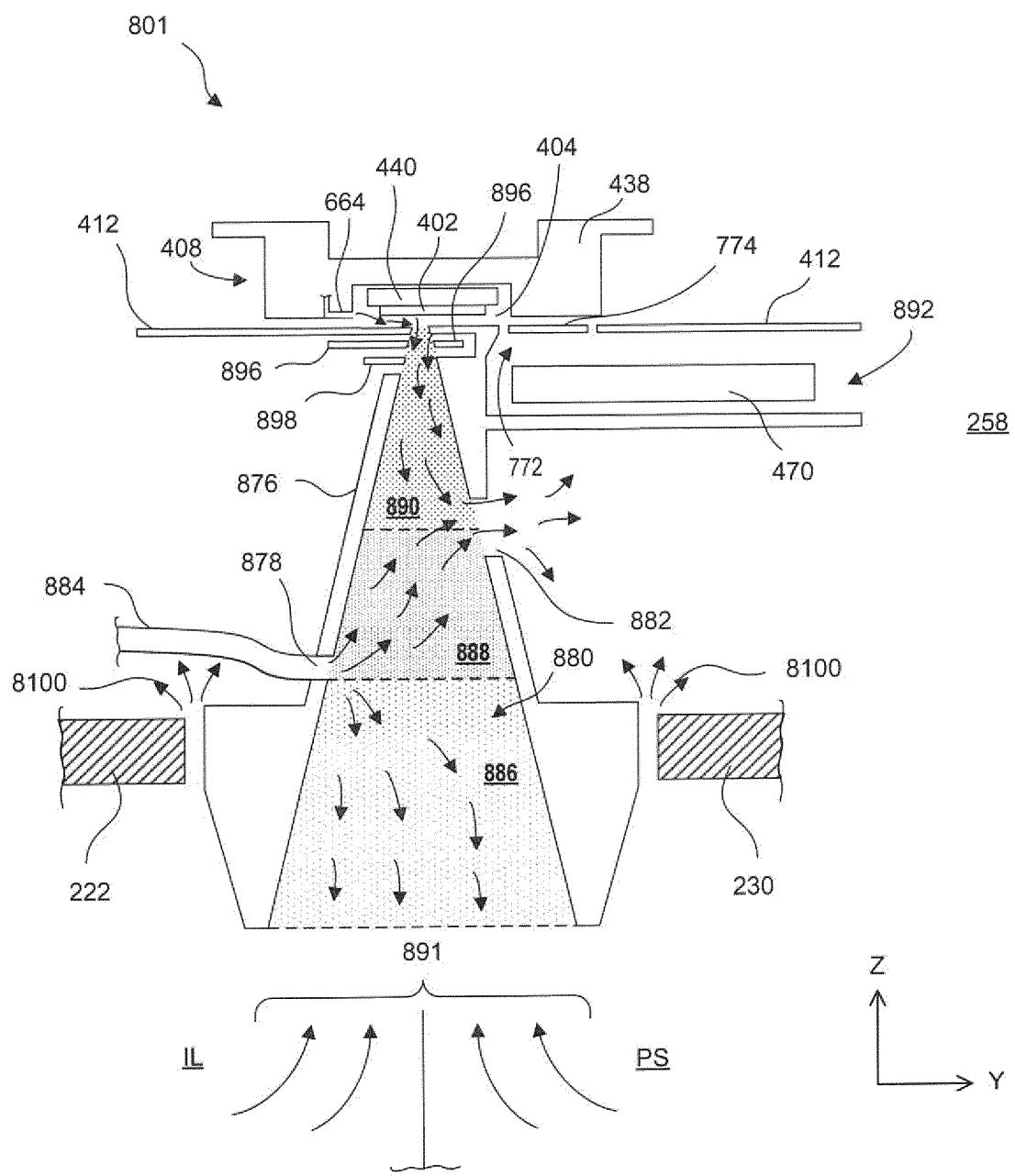
FIG. 8 schematically depicts a partial cross-section of a lithographic apparatus having a reticle stage, an illumination system, a projection system, and an encapsulating structure, according to an embodiment.

FIG. 8 illustrates one such embodiment. As shown in FIG. 8, lithographic apparatus 801 may include an encapsulating structure 876. Encapsulating structure 876 extends between stationary plate 412 and both illumination system IL and projection system PS, as shown in FIG. 8. Encapsulating structure 876 encapsulates (i.e., surrounds) a path of the radiation from illumination system IL, to patterning device 402, and then to projection system PS. An exemplary radiation path is also shown in FIG. 2. In some embodiments, encapsulating structure 876 defines a substantially pyramidal frustum volume 880 as shown in FIG. 8 that corresponds to the substantially conical radiation path from illumination system IL, to patterning device 402, and then to projection system PS. In other embodiments, encapsulating structure 876 defines other shaped interior volumes 880 such as conical frustum shape.

Encapsulating structure 876 can include at least one gas inlet 878 configured to inject gas into volume 880, and at least one gas exhaust 882 configured to remove gas from volume 880. Although only one gas inlet 878 is shown in FIG. 8, encapsulating structure 876 can include two or more gas inlets 878 (e.g., another gas inlet on the wall of encapsulating structure 876 opposing the illustrated gas inlet 878 in FIG. 8). Gas inlet 878 is fluidly connected to a gas supply via one or more conduits 884. In some embodiments, gas inlet 878 is positioned between gas exhaust 882 and both illumination system IL and projection system PS, and gas exhaust 882 is positioned between opening 420 defined by stationary plate 412 and gas inlet 878.

Gas inlet 878 can be integrally formed by encapsulating structure 876 in some embodiments, or gas inlet 878 can be separate a component coupled to encapsulating structure 876 in some embodiments. Each gas inlet 878 can be a single opening (e.g., a slit or letterbox opening extending along the X-axis or an opening extending around the entire perimeter of encapsulating structure 876), a plurality of openings (e.g., double slits or letterbox openings, or double opening extending around the entire perimeter of encapsulating structure 876), or a nozzle in some embodiments.

Gas inlet 878 and gas exhaust 882 can be configured (e.g., sized, shaped, positioned, injected and removed flow rate, etc.) to create a plurality of gas flows that suppress molecular and particle contamination traveling from illumination system IL and projection system PS toward first chamber 404 via opening 420, and that suppress molecular and particle contamination traveling from first chamber 404, via opening 420, into illumination system IL and projection system PS.

For example, as shown in FIG. 8, gas inlet 878 is configured to create a first region 886 between gas inlet 878 and both illumination system IL and projection system PS. In first region 886, gas flows in the direction from gas inlet 878 toward both illumination system IL and projection system PS. This gas flow in region 886 suppresses molecular and particle contamination traveling from illumination system IL and projection system PS from entering region 886 (and in turn first chamber 404 housing patterning device 402). In some embodiments, one or both of illumination system IL and projection system PS can be fluidly connected to a gas supply (for example, gas supply 256 in FIG. 2) that generates a gas flow 891 out of illumination system IL and projection system PS and toward first chamber 404. The gas flow in region 886 suppresses any molecular and particle contamination carried by gas flow 891 out of one or both of illumination system IL and projection system PS.

Gas inlet 878 and gas exhaust 882 are configured to create a second region 888 between gas inlet 878 and gas exhaust 882. In second region 888, gas flows in the direction from gas inlet 878 toward first chamber 404, and out gas exhaust 882. This gas flow direction in region 888 suppresses molecular contamination traveling from first chamber 404 from entering region 888 (and consequently illumination system IL and projection system PS).

Gas exhaust 882 and gas inlets 664 are configured to create a third region 890 between opening 420 defined by stationary plate 412 and gas exhaust 882. In third region 890, gas flows in the direction out opening 420 toward illumination system IL and projection system PS, and out gas exhaust 882. This gas flow in region 890 suppresses particle contamination traveling from illumination system IL and projection system PS toward first chamber 404 from entering first chamber 404.

In some embodiments, gas inlet 878, gas exhaust 882, and gas inlet 664 are configured such that the gas flow velocities in region 888 and region 890 are balanced to ensure that any particle contaminants accelerated upwards in region 888 is suppressed by gas flow in region 890, blocking entry into first chamber 404.

Figure 9:
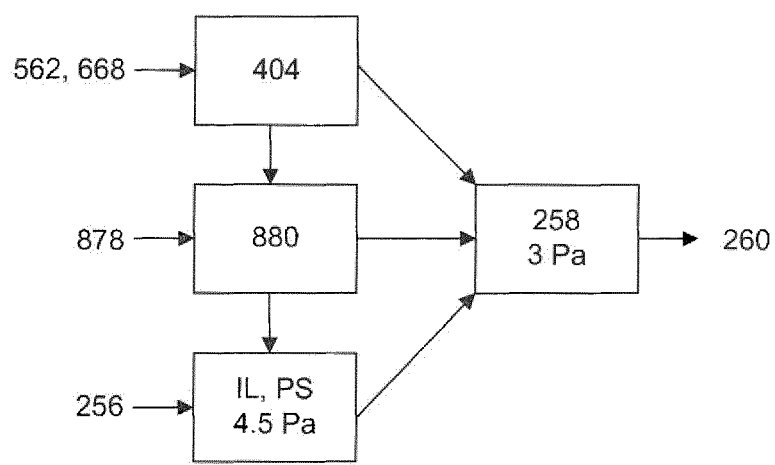
FIG. 9 is a block diagram of the lithographic apparatus of FIG. 8, showing the gas flow directions and pressures, according to an embodiment.

Collectively referencing FIGS. 2 and 8, the pressure in first chamber 404 can be greater than the average pressure in volume 880 (including regions 886, 888, and 890). And the average pressure in volume 880 can be great than the environment including illumination system IL and projection system PS. FIG. 9 illustrates a diagram of one such vacuum system and the resulting net gas flow directions according to such embodiments.

In some embodiments, encapsulating structure 876 defines a volume 892 configured to house at least a portion of robotic reticle exchange device 470. When the portion of robotic reticle exchange device 470 is received in volume 892, the portion of robotic reticle exchange device 470 is aligned with opening 772, thereby allowing robotic reticle exchange device 470 (when aligned with opening 772) to exchange a patterning device 402 mounted on first structure 408.

In some embodiments, encapsulating structure 876 defines one or more openings 894 configured to allow one or more light blocking elements, which are configured to selectively block a part of the radiation passing through volume 880, to enter volume 880. For example, opening 894 in FIG. 8 can be configured to allow one or more reticle masking blades 896 (sometimes referred to as REMA blades) to enter volume 880 and block a part of the radiation passing there through, for example, to shield a pattern free dark area around a die on patterning device 402 from the exposure light. Openings 894 can also be configured to allow one or more spatial uniformity or non-uniformity blades 898 (sometimes referred to as a Unicom) to control uniformity of the radiation passing there through. In some embodiments, openings 894 are sized such that any gaps between the surfaces defining openings 894 and REMA blades 896 and Unicom 898 imposes a sufficient gas-flow resistance so as to not interfere with the above described gas flows in regions 886, 888, and 890 of volume 880.

Although gas inlet 664 is disposed on first structure 408 in FIG. 8, one or more gas inlets can be disposed on stationary plate similar to gas inlets 558 in FIG. 5, or any other suitable location, in some embodiments.

Figure 10:
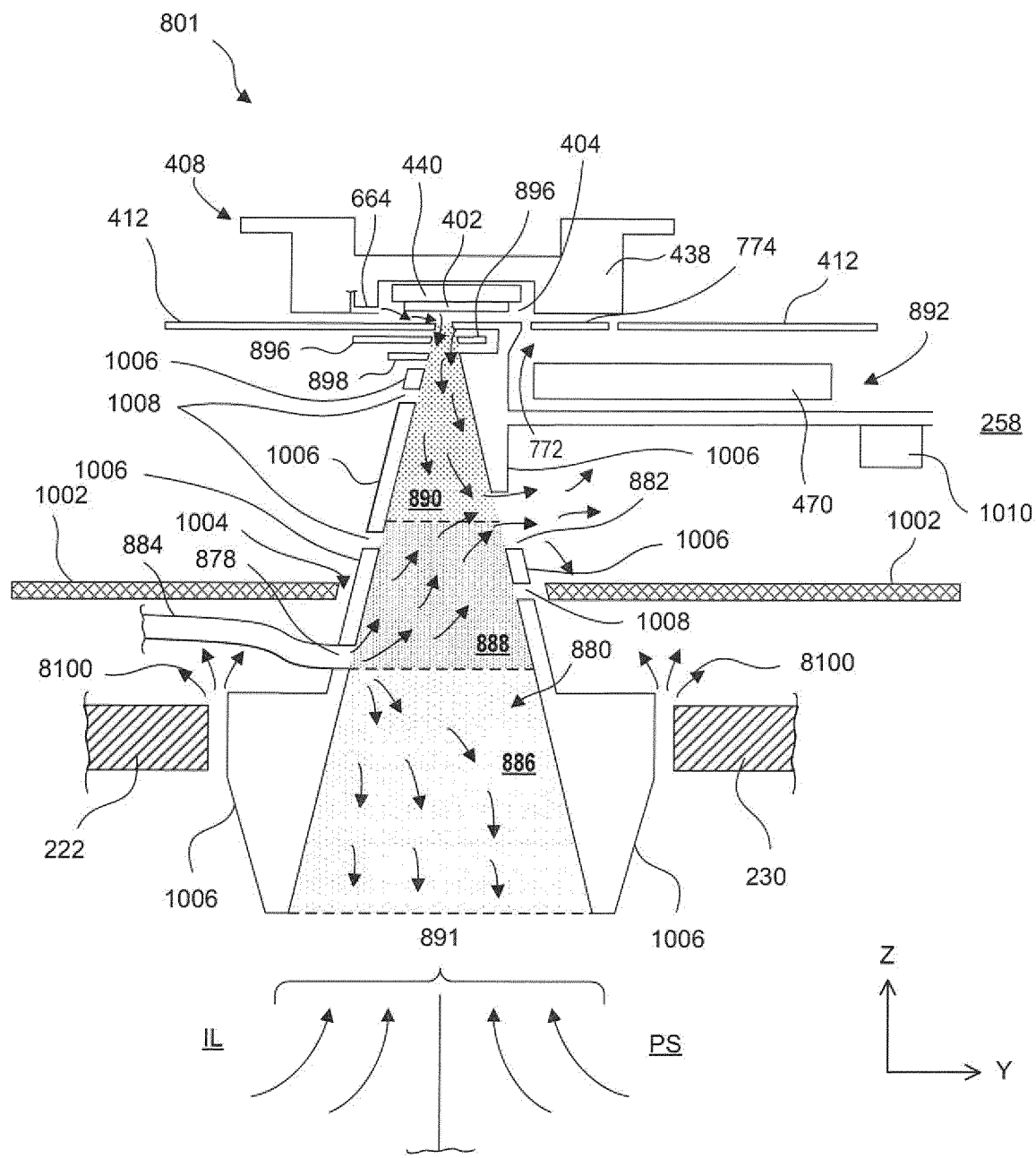
FIG. 10 schematically depicts a partial cross-section of a lithographic apparatus having a reticle stage, an illumination system, a projection system, and an encapsulating structure, according to another embodiment.
Figure 11:
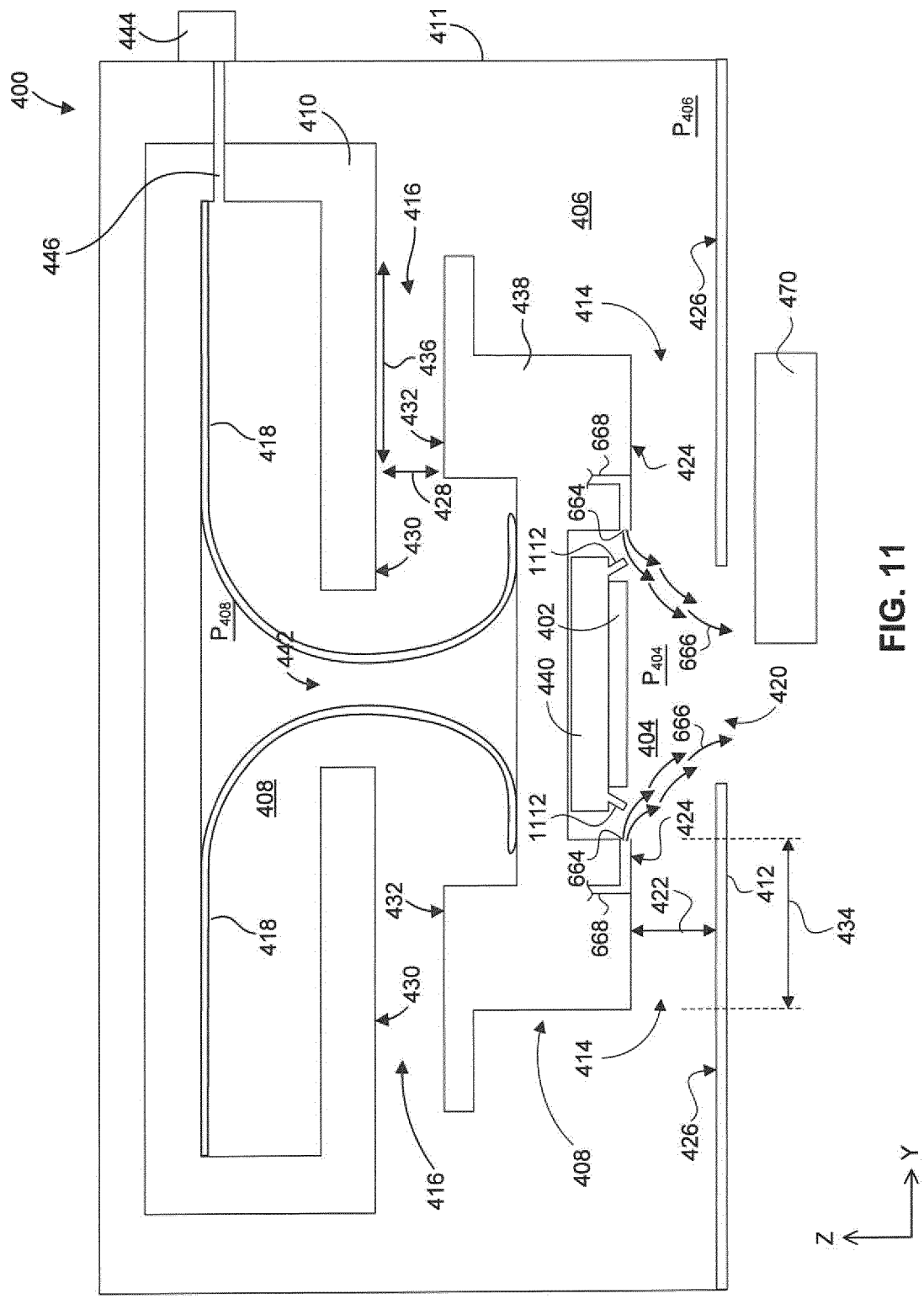
FIG. 11 schematically depicts a cross-section of a reticle stage having baffles, according to an embodiment.

As shown in FIG. 8, gas can leak from illumination system IL and projection system PS into a portion of environment 258 (as described above with reference to FIG. 2) between stationary plate 412 and both illumination system IL and projection system PS. For example, gas can leak from seams between mirror devices 222 and 224 (as described above with reference to FIG. 2) and encapsulating structure 876 in environment 258, thereby creating gas flows 8100 toward first chamber 404. Accordingly, in some embodiments, lithographic apparatus 801 can include a second stationary plate 1002 that provides an additional barrier between gas flows 8100 and patterning device 402 in first chamber 404, as shown in FIG. 10. Plate 1002 can define an opening 1004 through which encapsulating structure 876 passes. Plate 1002 is positioned between stationary plate 412 and both illumination system IL and projection system PS. In some embodiments, second plate 1002 is positioned between gas inlet 878 and stationary plate 412. In some embodiments (not shown), second plate 1002 is positioned between gas exhaust 882 and stationary plate 412. In some embodiments (not shown), plate 1002 is positioned between gas inlet 878 and both illumination system IL and projection system PS.

In some embodiments (as shown in FIG. 10), encapsulating structure 876 is made of plurality of separate segments 1006 defining gaps 1008 there between. Gaps 1008 can create an undesirable particle transport path from illumination system IL and projection system PS toward patterning device 402 in first chamber 404. Second stationary plate 1002 can provide an additional barrier between gas flowing out of gaps 1008 (for example, gaps 1008 between second stationary plate 1002 and illumination system IL and projection system PS) and patterning device 402 in first chamber 404 as shown in FIG. 10. In some embodiments, second stationary plate 1002 includes a first portion fixed illumination system IL, and a second portion fixed to projection system PS. In some embodiments, stationary plate 1002 is made of a single material, which can make cleaning stationary plate 8102 easier than cleaning illumination system IL and projection system PS, which can be made of many different materials. In some embodiments, stationary plate 1002 is made of metal, for example, stainless steel, nickel coated aluminum, or any other suitable metal. In some embodiments, stationary plate 1002 is made of plastic or any other suitable material.

In some embodiments, lithographic apparatus 801 also includes an electrostatic precipitator 1010 configured to capture any contamination particles. Electrostatic precipitator 1010 can be positioned within environment 258 outside of encapsulating structure 876 and between stationary plate 1002 and stationary plate 412, in some embodiments. Electrostatic precipitator 1010 can be configured to capture any particles that remain in environment 258 outside of encapsulating structure 876. Because electrostatic precipitator 1010 is positioned in a generally dark area of environment 258 outside of encapsulating structure 876, electrostatic precipitator 1010 remains effective despite any EUV radiation (which can degrade electrostatic precipitator performance) within encapsulating structure.

In some embodiments, gaps 1008 are configured to each have a variable effective gap height (i.e., the sum of the gap dimensions along a direction transverse to the direction of gas flow). For example, one or more of gaps 1008 can each be configured to have a first configuration having a first effective gap height, and a second configuration having a second effective gap height smaller than the first effective gap height. In some embodiments, for example, one or more of gaps 1008 can each be configured to have a first configuration at which the smallest effective gap height is at least about 10 mm, and a second configuration at which the smallest effective gap height is no more than about 4 mm. For example, in the first configuration of gaps 1008, encapsulating structure 876 can be assembled or serviced, and in the second configuration of gaps 1008, a gas flow 1317 traveling from volume 880 defined by encapsulating structure 876 to environment 258 is reduced relative to the first configuration. FIGS. 13A, 13B, 14A, 14B, 15A, and 15B illustrate various embodiments of a gap 1008 configured to have a variable effective gap height.

Figure 13A:
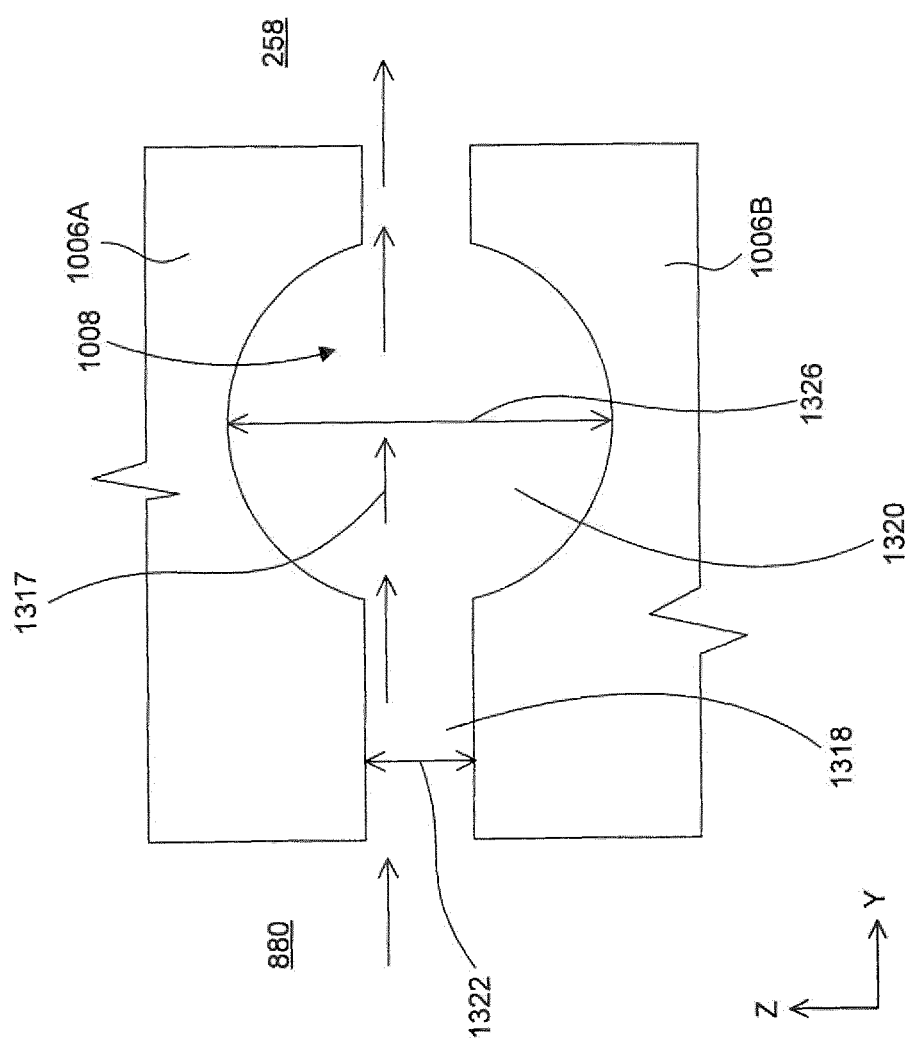
FIGS. 13A and 13B schematically depict first and second configurations, respectively, of a gap between segments of an encapsulating structure, according to an embodiment.
Figure 13B:
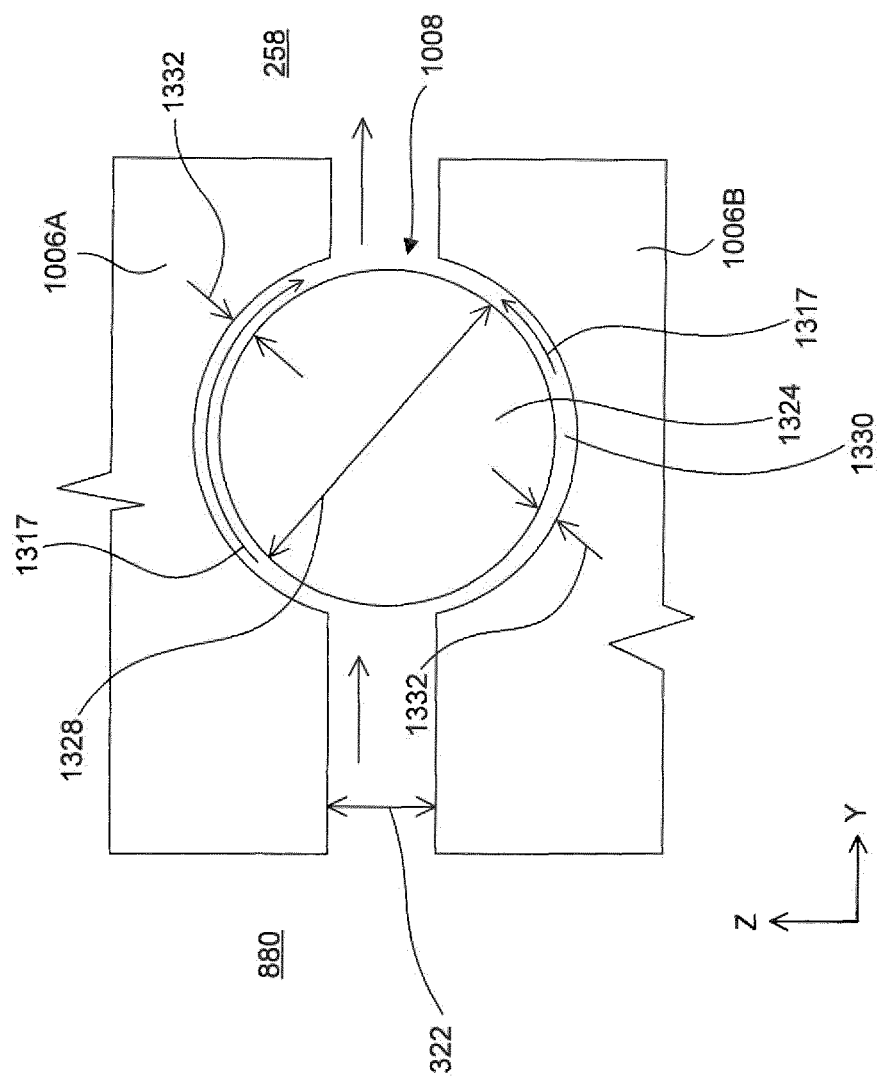

FIGS. 13A and 13B illustrate first and second configurations, respectively, of gap 1008, according to an embodiment. Gap 1008 is defined between a first segment 1006A and a second segment 1006B of encapsulating structure 876. Gas flow 1317 can travel through gap 1008 from volume 880 defined by encapsulating structure 876 to environment 258. Gap 1008 includes at least a first gap portion 1318 (e.g., the portion adjacent environment 258) and a second gap portion 1320 configured to receive a movable object 1324. As shown in FIG. 13A, the smallest effective gap height of gap 1008 (including gap portion 1318 and gap portion 1320) in the first configuration can be a gap height 1322 of first gap portion 1318. In some embodiments, gap height 1322 is at least about 10 mm, thereby allowing for servicing and assemble of encapsulating structure 876. Gap portion 1320 is configured to receive object 1324 such that object 1324 can be inserted into and removed from gap portion 1320. In the second configuration of gap 1008, object 1324 is inserted within gap portion 1320. For example, movable object 1324 can be translated into gap portion 1320 along a direction transverse to the direction of gas flow 1317 (e.g., along the X-axis in FIGS. 13A and 13B).

Gap portion 1320 can be substantially circular in the Y-Z plane as shown in FIGS. 13A and 13B, in some embodiments. And gap portion 1320 can have a diameter 1326. In other embodiments, gap portion 1320 can have non-circular cross-sectional shape (e.g., rectangular) in the Y-Z plane.

Movable object 1324 is configured (i.e., supported, positioned, shaped, and sized) to be inserted into gap portion 1320 along a direction transverse to the direction of gas flow 1317 (e.g., along the X-axis in FIGS. 13A and 13B). In some embodiments, the cross-sectional shape of object 1324 along the Y-Z plane substantially conforms to the shape of gap portion 1320. For example, as shown in FIG. 13B, object 1324 has a circular cross-sectional shape that substantially confirms to the circular cross-sectional shape of portion 1324. As shown in FIG. 13B, object 1324 has a diameter 1328 that is smaller than diameter 1326 of gap portion 1320. Accordingly, when object 1324 is inserted within gap portion 1320, the effective gap height of gap 1008 at gap portion 1320 is equal to the difference between diameter 1326 of gap portion 1320 and diameter 1328 of object 1328. In some embodiments, object 1324 is centered within gap portion 1320, thereby forming two small channels 1330. Each channel 1330 has a gap height 1332. At the second configuration when object 1324 is inserted within gap portion 1320, the sum of both gap heights 1332 is the smallest effective gap height of gap 1008. In some embodiments, the sum of both gap heights 1332 of channels 1330 is no more than about 4 mm (i.e., about 4 mm or smaller). For example, each gap height 1332 can be about 2 mm. In other embodiments, each gap height 1332 can be smaller than about 2 mm.

The smallest effective gap height of gap 1008 at the second configuration is smaller than the smallest effective gap height of gap 1008 in the first configuration. Accordingly, gas flow 1317 through gap 1008 from volume 880 defined by encapsulating structure 876 to environment 258 is reduced at the second configuration relative to the first configuration.

Figure 14A:
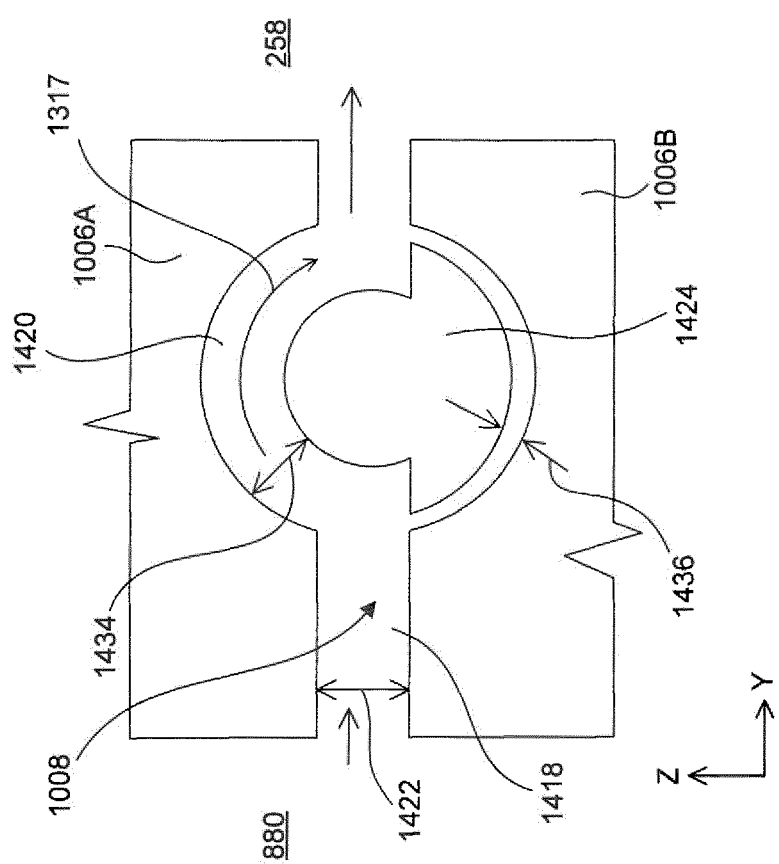
FIGS. 14A and 14B schematically depict first and second configurations, respectively, of a gap between segments of an encapsulating structure, according to an embodiment.
Figure 14B:
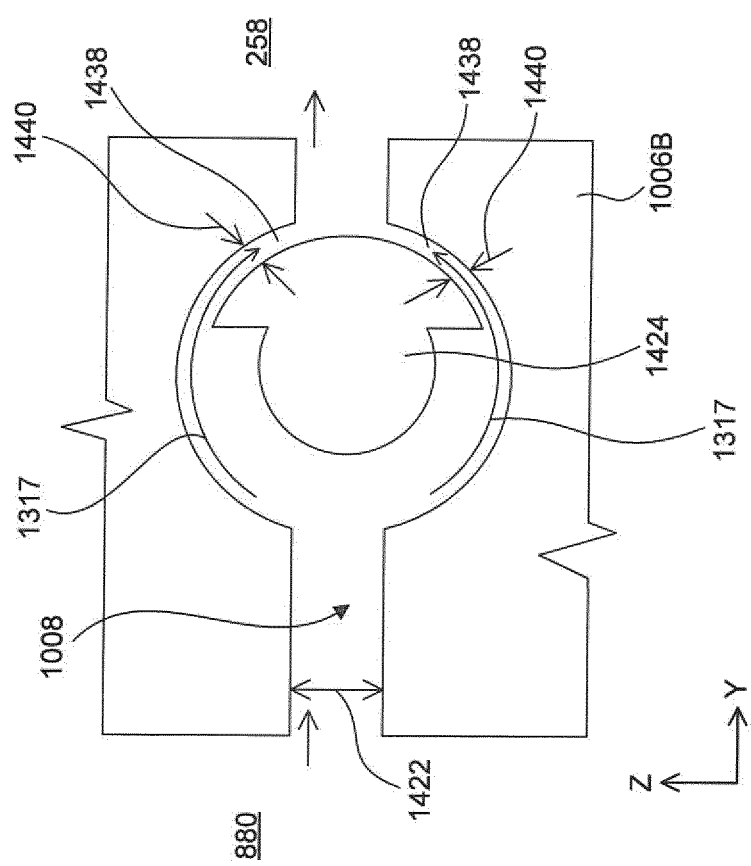

FIGS. 14A and 14B illustrate first and second configurations, respectively, of gap 1008, according to another embodiment having a variable effective gap height. As shown in FIGS. 14A and 14B, gap 1008 can include at least a first gap portion 1418 (e.g., the portion adjacent environment 258) and a second gap portion 1420 that houses a rotatable object 1424. Object 1424 is configured to rotate between at least two positions about an axis transverse to the direction of gas flow 1317 (e.g., about the X-axis in FIGS. 14A and 14B). For example, FIG. 14A illustrates object 1424 at a first position (i.e., the first configuration of gap 1008), and FIG. 14B illustrates object 1424 at a second position (i.e., the second configuration of gap 1008) rotated 90 degrees about the X-axis relative to the first position shown in FIG. 14A.

Rotatable object 1424 is configured (i.e., positioned, shaped, and sized) such that the smallest effective gap height of gap 1008 at the first configuration is greater than the smallest effective gap height of gap 1008 at the second configuration. In some embodiments, the smallest effective gap height of gap 1008 at the first configuration is at least about 10 mm. For example, as shown in FIG. 14A, a gap height 1422 of first gap portion 1418 can be at least about 10 mm, and the sum of (a) a gap height 1434 between object 1424 and segment 1006A and (b) a gap height 1436 between object 1424 and segment 1006B is at least about 10 mm. And in some embodiments, gap height 1436, itself, is at least about 10 mm.

Rotatable object 1424 is also configured (i.e., positioned, shaped, and sized) such that the smallest effective gap height of gap 1008 at the second configuration is smaller than the smallest effective gap height of gap 1008 at the first configuration. In some embodiments, the smallest effective gap height of gap 1008 at the second configuration is no more than about 4 mm (i.e., about 4 mm or smaller). For example, as shown in FIG. 14B, in the second configuration when object 1424 is rotated 90 degrees about the X-axis relative to the position of FIG. 14A, object 1424 forms two channels 1438 each having a gap height 1440. When object 1424 is rotated to the second position (the second configuration of gap 1008), the sum of both gap heights 1440 is the smallest effective gap height of gap 1008. In some embodiments, the sum of both gap heights 1440 of channels 1438 is no more than about 4 mm. For example, each gap height 1440 can be about 2 mm. In other embodiments, each gap height 1440 can be smaller than about 2 mm.

The smallest effective gap height of gap 1008 at the second configuration is smaller than the smallest effective gap height of gap 1008 in the first configuration. Accordingly, gas flow 1317 traveling through gap 1008 from volume 880 defined by encapsulating structure 876 to environment 258 is reduced at the second configuration relative to the first configuration.

Figure 15A:
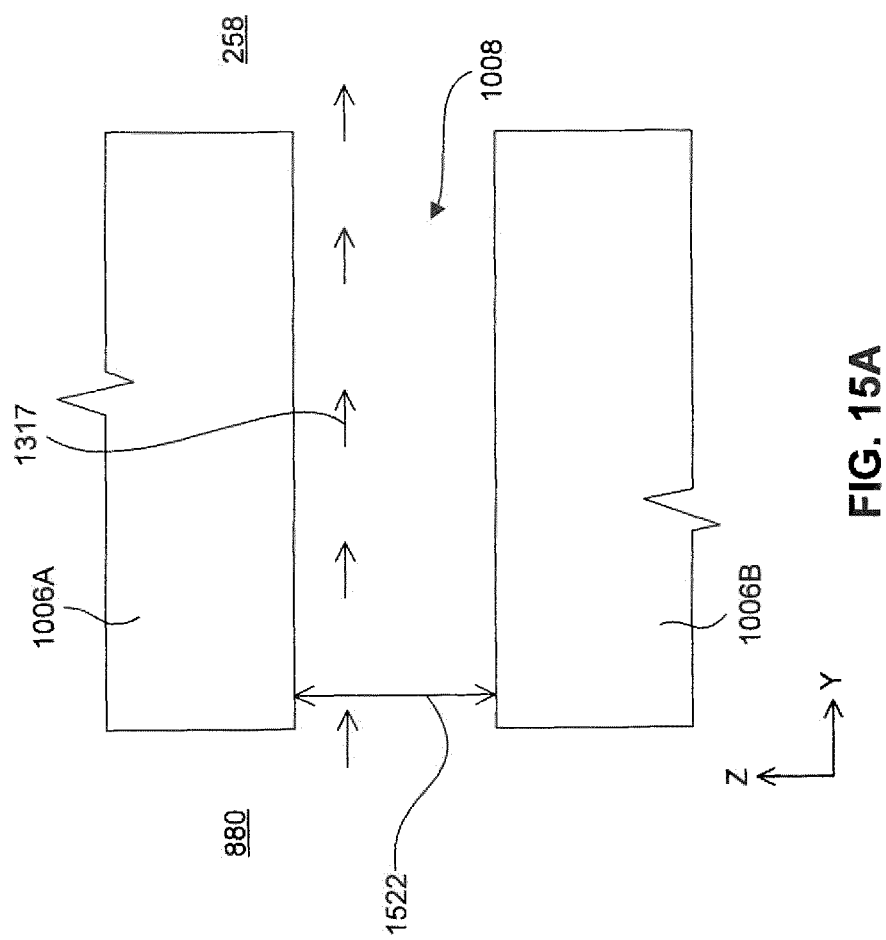
FIGS. 15A and 15B schematically depict first and second configurations, respectively, of a gap between segments of an encapsulating structure, according to an embodiment.
Figure 15B:
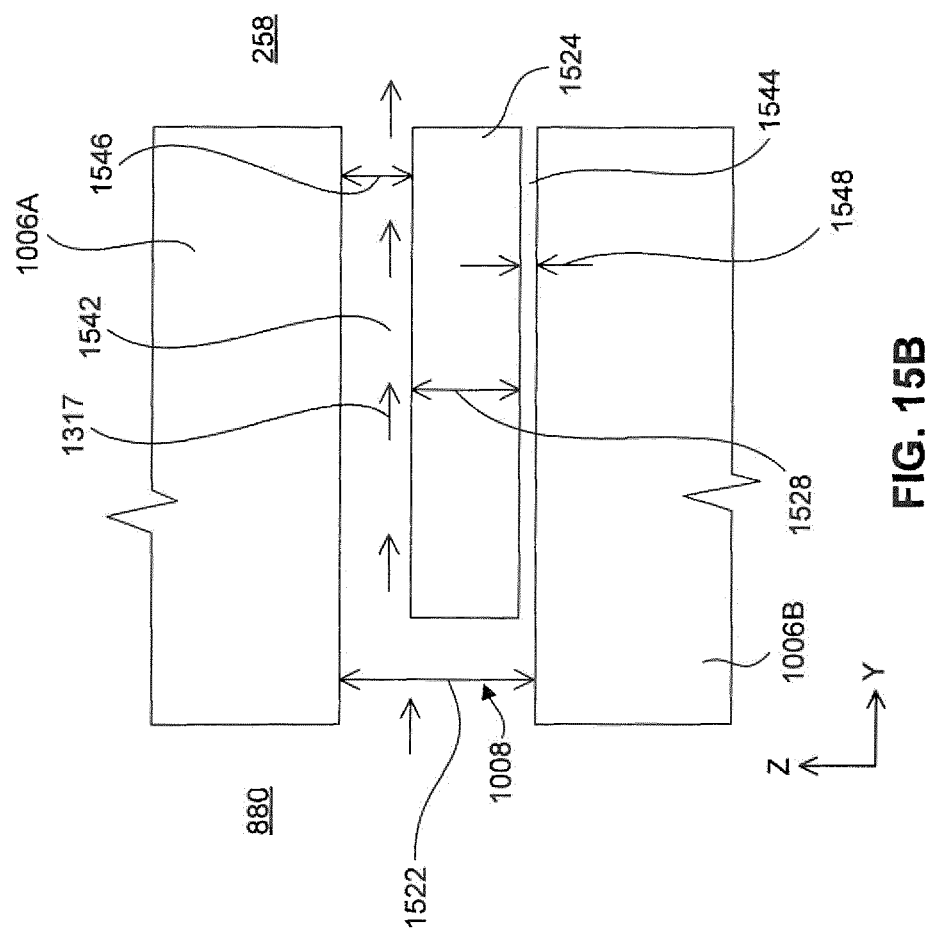

FIGS. 15A and 15B illustrate first and second configurations, respectively, of gap 1008, according to yet another embodiment having a variable gap height. Again, gap 1008 is defined between first segment 1006A and second segment 1006B of encapsulating structure 876. Gas flow 1317 can travel through gap 1008 from volume 880 defined by encapsulating structure 876 to environment 258. As shown in FIGS. 15A and 15B, gap 1008 can have a substantially constant effective gap height 1522 along the span between environment 258 and volume 880. Gap height 1522 can be at least about 10 mm in some embodiments.

Gap 1008 is configured to receive object 1524 that is movable relative to segments 1006A and 1006B. Object 1524 can be inserted into and removed from gap 1008. The second configuration of gap 1008 is formed when object 1524 is inserted within gap 1008. In some embodiments, movable object 1524 can be translated into and removed from gap 1008 along a direction transverse to the direction of gas flow 1317 (e.g., along the X-axis in FIGS. 15A and 15B).

In some embodiments, the cross-sectional shape of object 1524 along the Y-Z plane is rectangular (including, e.g., a square). As shown in FIG. 15B, object 1324 has a height 1528 that is smaller than gap height 1522 of gap 1008. Accordingly, in the second configuration when object 1524 is inserted within gap 1008, the smallest effective gap height of gap 1008 is equal to the difference between height 1522 of gap 1008 and height 1528 of object 1524. In some embodiments, object 1524 is offset (e.g., in the Z-direction) from the center of gap 1008. As such, two channels 1542 and 1544 are formed between object 1524 and respective segments 1006A and 1006B. Channel 1542 can have a gap height 1546, and channel 1542 can have a gap height 1548. The smallest effective gap height is equal to the sum of gap height 1546 and gap height 1548. In some embodiments, the sum of gap heights 1546 and 1548 is no more than about 4 mm. For example, gap height 1546 can be about 3 mm, and gap height 1548 can be about 1 mm.

In other embodiments (not shown), object 1528 can be centered in gap 1008 such that gap height 1546 of channel 1540 and gap height 1548 of channel 1543 are substantially equal. For example, gap heights 1546 and 1548 can each be about 2 mm in some embodiments. In other embodiments, gap heights 1546 and 1548 can each be smaller than about 2 mm. Although the above embodiments in FIGS. 13A, 13B, 14A, 14B, 15A, and 15B are discussed with respect to a gaps between segments of encapsulating structure 876, these gap configurations can be applied to gaps between segments of other components (e.g., substrate table WT, wafer stage, wafer handler, reticle handler, or other components sensitive to particle contamination) of a lithography apparatus (e.g., lithography apparatuses 100 and 100' as described in this disclosure), or other particle sensitive apparatus such as metrology systems, tubes, gas flow ducts, or boxes of gas ducts/pipes.

In some embodiments, in addition to sealing gap 414, reticle stage 400 can include a plurality of baffles 1112 projecting from second part 440 of first structure 408 to which patterning device 402 is mounted. As such, baffles 112 are positioned in close proximity to patterning device 402 and between gap 414 and patterning device 402 along the Y-axis. Baffles 1112 are configured to scoop up or block any particles that may have passed through gap 414 into first chamber 404 before they reach patterning device 402. In some embodiments, the surfaces of baffles 1112 include micro-baffles that further randomize the bounces of contamination particles in chamber 404, which can increase the number of bounces required before reaching patterning device 402 and, in turn, increase the probability that the particles will stop before reaching patterning device 402. That is, the micro-baffles form a particle trap.

In some embodiments, the injected gas of any of the above described embodiments includes hydrogen ($H_2$). According to some examples, hydrogen can be used both as background gas during EUV exposure and for particular suppressing gas injection in the embodiments of this disclosure. Additionally or alternatively, a gas with heavier molecular or atomic species can be used to increase scattering, cross-section, and momentum transfer. For example, helium (He), nitrogen ($N_2$), Argon (Ar), etc. can be used in the embodiments of this disclosure. In some embodiments, the injected gas is substantially free of any containment particles. However, it is noted that these gases are provided as examples and other gases can also be used in the embodiments of this disclosure. These examples of injected gases (or any combination thereof) may be used in any of above described embodiments. In these embodiments, one or more gas supplies coupled to the gas inlets may supply the gas.

The embodiments may further be described using the following clauses:

1. A lithographic apparatus comprising:
   an illumination system configured to condition a radiation beam;
   a first stationary plate defining a first opening and comprising a first surface; and
   a reticle stage defining, along with the first stationary plate, a first chamber, wherein:
   the reticle stage is configured to support a reticle in the first chamber, and
   the reticle stage comprises a first surface spaced apart from a second surface of the first stationary plate, thereby defining a first gap between a second chamber and the first chamber, and
   the first gap is configured to suppress the amount of contamination passing from the second chamber to the first chamber; and
   a projection system configured to project a pattern imparted to the radiation beam by the patterning device onto a substrate,
   wherein the first stationary plate is between the reticle stage and the illumination system and the projection system.

2. The lithographic apparatus of clause 1, wherein the first gap is also configured to maintain a pressure difference between a pressure of the first chamber and a pressure of the second chamber.

3. The lithographic apparatus of clause 1, further comprising a first gas inlet configured to inject gas into the first chamber.

4. The lithographic apparatus of clause 3, wherein the gas inlet is disposed on the reticle stage comprises the gas inlet.

5. The lithographic apparatus of clause 3, wherein the gas inlet is disposed on the first stationary plate.

6. The lithographic apparatus of clause 3, further comprising:
an encapsulating structure extending between the first stationary plate and the illumination system and the projection system;
wherein the encapsulating structure encapsulates a path of the radiation beam from the illumination system, to the reticle, and then to the projection system;
wherein the encapsulating structure comprises:
a second gas inlet configured to inject gas into a volume defined by the encapsulating structure, and
a gas exhaust between the gas inlet and the first stationary plate that is configured to remove gas from the volume defined by the encapsulating structure; and
wherein the first gas inlet, the second gas inlet, and the gas exhaust are collectively configured to generate:
a first region between the first stationary plate and the gas exhaust comprising gas flowing toward the gas exhaust, thereby suppressing the amount of contamination passing from the first region to the first chamber,
a second region between the gas exhaust and the second gas inlet comprising gas flowing toward the gas exhaust, thereby suppressing the amount of contamination passing from the first chamber to the illumination system and the projection system, and
a third region between (a) the second gas inlet and (b) the illumination system and the projection system, and comprising gas flowing the illumination system and the projection system, thereby suppressing the amount of contamination passing from the illumination system and the projection system to the third region.

7. The lithographic apparatus of clause 6, wherein the encapsulating structure comprises a plurality of spaced apart segments forming gaps between adjacent segments.

8. The lithographic apparatus of clause 7, further comprising a second stationary plate defining a second opening positioned between (a) the first stationary plate and (b) both the illumination system and the projection system such that the encapsulating structure passes through the second opening.

9. The lithographic apparatus of clause 8, further comprising an electrostatic precipitator positioned between the first stationary plate and the second stationary plate, and outside the volume defined by the encapsulating structure.

10. The lithographic apparatus of clause 8, wherein the gaps formed between adjacent segments of the encapsulating structure each have a first configuration having a first effective gap height and a second configuration having a second effective gap height different than the first effective gap height.

11. The lithographic apparatus of clause 10, wherein:
the first configuration comprises the respective gap formed between adjacent segments without an movable object being inserted therein; and
the second configuration comprises the movable object being inserted within the respective gap formed between adjacent segments, thereby forming the second effective gap height.

12. The lithographic apparatus of clause 11, wherein the first effective gap height is substantially constant between the volume defined by the encapsulating structure and an environment surrounding the encapsulating structure.

13. The lithographic apparatus of clause 11, wherein the object has a cross-sectional shape that substantially conforms to a cross-sectional shape of a portion of the respective gap formed between adjacent segments of the encapsulating structure in which the object is inserted.

14. The lithographic apparatus of clause 13, wherein the cross-sectional shape of the object and the cross-sectional shape of the portion of the respective gap are each circular.

15. The lithographic apparatus of clause 10, wherein:
the first configuration comprises a rotatable object positioned at a first position within a respective gap formed between adjacent segments, thereby forming the first effective gap height; and
the second configuration comprises the rotatable object being rotated to a second position within the respective gap formed between adjacent segments, thereby forming the second effective gap height.

16. The lithographic apparatus of clause 1, wherein the first opening of the first stationary plate is configured to allow (a) the radiation beam to pass from the illumination system to the reticle, and (b) a reticle exchange device to exchange the reticle supported by the reticle stage.

17. The lithographic apparatus of clause 1, wherein:
the first stationary plate further defines a second opening configured to allow reticle exchange device to exchange the reticle supported by the reticle stage; and
the lithographic apparatus further comprises a movable hatch configured to selectively cover the second opening.

18. The lithographic apparatus of clause 1, the lithographic apparatus further comprises a movable hatch configured to selectively cover a portion of the first opening.

19. The lithographic apparatus of clause 1, wherein the reticle stage further comprises a baffle projecting into the first chamber between the gap and the reticle, the baffle being configured to suppress the amount of contamination passing from the gap to the reticle.

20. The lithographic apparatus of clause 19, wherein the baffle comprises a plurality micro-baffles, thereby forming a particle trap.

21. The lithographic apparatus of clause 1, wherein the reticle stage comprises:
a first stationary structure comprising a third surface; and
a second structure configured to the support the reticle in the first chamber, movable relative to the first stationary structure, and comprising a fourth surface spaced apart from the third surface of the first stationary structure, thereby defining a second gap between a third chamber and the second chamber, wherein the third gap is configured to suppress the amount of contamination passing from the third chamber to the first chamber.

22. The lithographic apparatus of clause 21, wherein:
the second structure of the reticle stage comprises a long stroke module and a short stroke module configured to receive the reticle; and
the first surface is part of the long stroke module.

23. The lithographic apparatus of clause 1, further comprising a radiation source configured to emit extreme ultraviolet (EUV) radiation.

24. The lithographic apparatus of clause 1, wherein the first chamber and the second chamber are each configured to be held at a vacuum pressure.

25. A lithographic apparatus comprising:
a radiation source configured to emit extreme ultraviolet (EUV) radiation;

an illumination system configured to condition the EUV radiation;

a first stationary plate defining a first opening and comprising a first surface; and a reticle stage defining, along with the first stationary plate, a first chamber, wherein:

the reticle stage is configured to support a reticle in the first chamber, and the reticle stage comprises a first surface spaced apart from a second surface of the first stationary plate, thereby defining a first gap between a second chamber and the first chamber, and the first gap is configured to suppress the amount of contamination passing from the second chamber to the first chamber;

a first gas inlet configured to inject gas into the first chamber;

a projection system configured to project a pattern imparted to the radiation beam by the patterning device onto a substrate; and an encapsulating structure extending between (a) the first stationary plate and (b) both the illumination system and the projection system, wherein the encapsulating structure encapsulates a path of the EUV radiation from the illumination system, to the reticle, and then to the projection system, and wherein the encapsulating structure comprises:

a second gas inlet configured to inject gas into a volume defined by the encapsulating structure, and a gas exhaust between the gas inlet and the first stationary plate that is configured to remove gas from the volume defined by the encapsulating structure;

the first gas inlet, the second gas inlet, and the gas exhaust are collectively configured to generate:

a first region between the first stationary plate and the gas exhaust comprising gas flowing toward the gas exhaust, thereby suppressing the amount of contamination passing from the first region into the first chamber, a second region between the gas exhaust and the second gas inlet comprising gas flowing toward the gas exhaust, thereby suppressing the amount of contamination passing from the first chamber into the illumination system and the projection system, and a third region between (a) the second gas inlet and (b) the illumination system and the projection system, and comprising gas flowing toward the illumination system and the projection system, thereby suppressing the amount of contamination passing from the illumination system and the projection system into the third region, wherein the first stationary plate is between (a) the reticle stage and (b) both the illumination system and the projection system.

26. The lithographic apparatus of clause 25, wherein the gas inlet is part of the reticle stage or the first stationary plate.

27. The lithographic apparatus of clause 25, wherein:

the encapsulating structure comprises a plurality of spaced apart segments forming gaps between adjacent segments; and the lithographic apparatus further comprises a second stationary plate defining a second opening positioned between (a) the first stationary plate and (b) both the illumination system and the projection system such that the encapsulating structure passes through the second opening.

28. The lithographic apparatus of clause 25, wherein the gaps formed between adjacent segments of the encapsulating structure each have a first configuration having a first effective gap height and a second configuration having a second effective gap height different than the first effective gap height.

29. The lithographic apparatus of clause 25, wherein the first stationary plate further defines a second opening configured to allow reticle exchange device to exchange the reticle supported by the reticle stage; and the lithographic apparatus further comprises a movable hatch configured to selectively cover the second opening.

30. The lithographic apparatus of clause 25, the lithographic apparatus further comprises a movable hatch configured to selectively cover a portion of the first opening.

It is noted that although example designs are discussed in this disclosure, the embodiments of this disclosure are not limited to these examples. For example, the embodiments of this disclosure include any combination of the exemplary designs discussed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

Further, the terms "radiation" and "beam" used herein encompass all types of electromagnetic radiation, including ultraviolet (UV) radiation (for example, having a wavelength of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger)

is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

It should be understood that relative spatial descriptions between one or more particular features, structures, or characteristics used herein are for purposes of illustration only, and that practical implementations of the structures described herein may include misalignment tolerances without departing from the spirit and scope of the present disclosure.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. A lithographic apparatus comprising:
   an illumination system configured to condition a radiation beam;
   a first stationary plate defining a first opening and comprising a first surface; and
   a reticle stage defining, along with the first stationary plate, a first chamber, wherein:
      the reticle stage is configured to support a patterning device in the first chamber, and
      the reticle stage comprises a first surface spaced apart from a second surface of the first stationary plate, so as to define a first gap between a second chamber and the first chamber, wherein parts of the second chamber are located at opposite sides of the first opening, and
      the first gap is configured to suppress an amount of contamination passing from the second chamber to the first chamber; and
   a projection system configured to project a pattern imparted to the radiation beam by the patterning device onto a substrate, wherein the first stationary plate is between the reticle stage and the illumination system and the projection system.

2. The lithographic apparatus of claim 1, wherein the first gap is also configured to maintain a pressure difference between a pressure of the first chamber and a pressure of the second chamber.

3. The lithographic apparatus of claim 1, further comprising a first gas inlet configured to inject gas into the first chamber.

4. The lithographic apparatus of claim 3, wherein the first gas inlet is disposed on the reticle stage.

5. The lithographic apparatus of claim 3, wherein the first gas inlet is disposed on the first stationary plate.

6. An apparatus comprising:
   a first stationary plate defining a first opening and comprising a first surface;
   a reticle stage defining, along with the first stationary plate, a first chamber, wherein:
      the reticle stage is configured to support a patterning device in the first chamber,
      the reticle stage comprises a first surface spaced apart from a second surface of the first stationary plate, so as to define a first gap between a second chamber and the first chamber, and
      the first gap is configured to suppress an amount of contamination passing from the second chamber to the first chamber,
   wherein the first stationary plate is configured for being located between the reticle stage and an illumination system of a lithographic apparatus and a projection system of the lithographic apparatus, the illumination system configured to condition a radiation beam and the projection system configured to project a pattern imparted to the radiation beam by the patterning device onto a substrate; and
   an encapsulating structure extending between the first stationary plate and the illumination system and the projection system;
   wherein the encapsulating structure encapsulates a path of the radiation beam from the illumination system, to the patterning device, and then to the projection system;
   wherein the encapsulating structure comprises:
      a second gas inlet configured to inject gas into a volume defined by the encapsulating structure, and
      a gas exhaust between the second gas inlet and the first stationary plate that is configured to remove gas from the volume defined by the encapsulating structure; and
   wherein a first gas inlet, the second gas inlet, and the gas exhaust are collectively configured to generate:

a first region between the first stationary plate and the gas exhaust for gas flow toward the gas exhaust, so as to suppress an amount of contamination passing from the first region to the first chamber, a second region between the gas exhaust and the second gas inlet for gas flow toward the gas exhaust, so as to suppress an amount of contamination passing from the first chamber to the illumination system and the projection system, and a third region between (a) the second gas inlet and (b) the illumination system and the projection system, for gas flow toward the illumination system and the projection system, so as to suppress an amount of contamination passing from the illumination system and the projection system to the third region.

7. The apparatus of claim 6, wherein the encapsulating structure comprises a plurality of spaced apart segments forming gaps between adjacent segments.

8. The apparatus of claim 7, further comprising a second stationary plate defining a second opening positioned between (a) the first stationary plate and (b) both the illumination system and the projection system such that the encapsulating structure passes through the second opening.

9. The apparatus of claim 8, further comprising an electrostatic precipitator positioned between the first stationary plate and the second stationary plate, and outside the volume defined by the encapsulating structure.

10. The apparatus of claim 8, wherein the gaps formed between adjacent segments of the encapsulating structure each have a first configuration having a first effective gap height and a second configuration having a second effective gap height different than the first effective gap height.

11. The apparatus of claim 10, wherein:
the first configuration comprises the respective gap formed between adjacent segments without a movable object being inserted therein; and
the second configuration comprises a movable object being inserted within the respective gap formed between adjacent segments, so as to form the second effective gap height.

12. The apparatus of claim 11, wherein the first effective gap height is substantially constant between the volume defined by the encapsulating structure and an environment surrounding the encapsulating structure.

13. The apparatus of claim 11, wherein the object has a cross-sectional shape that substantially conforms to a cross-sectional shape of a portion of the respective gap formed between adjacent segments of the encapsulating structure in which the object is inserted.

14. The apparatus of claim 13, wherein the cross-sectional shape of the object and the cross-sectional shape of the portion of the respective gap are each circular.

15. The apparatus of claim 10, wherein:
the first configuration comprises a rotatable object positioned at a first position within a respective gap formed between adjacent segments, so as to form the first effective gap height; and
the second configuration comprises the rotatable object being rotated to a second position within the respective gap formed between adjacent segments, so as to form the second effective gap height.

16. The apparatus of claim 1, wherein the first opening of the first stationary plate is configured to allow (a) the radiation beam to pass from the illumination system to the patterning device, and (b) a reticle exchange device to exchange the patterning device supported by the reticle stage.

17. The apparatus of claim 1, wherein:
the first stationary plate further defines a second opening configured to allow a reticle exchange device to exchange the patterning device supported by the reticle stage; and
the apparatus further comprises a movable hatch configured to selectively cover the second opening.

18. The apparatus of claim 1, further comprising a movable hatch configured to selectively cover a portion of the first opening.

19. The apparatus of claim 1, wherein the reticle stage further comprises a baffle projecting into the first chamber between the gap and the patterning device, the baffle being configured to suppress an amount of contamination passing from the gap to the patterning device.

20. The apparatus of claim 19, wherein the baffle comprises a plurality of micro-baffles forming a particle trap.

21. The apparatus of claim 1, wherein the reticle stage comprises:
a first stationary structure comprising a third surface; and
a second structure configured to support the patterning device in the first chamber, movable relative to the first stationary structure, and comprising a fourth surface spaced apart from the third surface of the first stationary structure, so as to define a second gap between a third chamber and the second chamber, wherein the second gap is configured to suppress an amount of contamination passing from the third chamber to the first chamber.

22. The apparatus of claim 21, wherein:
the second structure of the reticle stage comprises a long stroke module and a short stroke module configured to receive the patterning device; and
the first surface is part of the long stroke module.

23. The apparatus of claim 1, further comprising a radiation source configured to emit extreme ultraviolet (EUV) radiation.

24. The apparatus of claim 1, wherein the first chamber and the second chamber are each configured to be held at a vacuum pressure.

25. The apparatus of claim 1, wherein the first surface is a major planar surface of the first stationary plate, and the first opening is defined by the major planar surface.

26. An apparatus comprising:
a first stationary plate defining a first opening and comprising a first surface;
a reticle stage defining, along with the first stationary plate, a first chamber, the reticle stage configured to support a patterning device in the first chamber and the reticle stage comprising:
a first surface spaced apart from a second surface of the first stationary plate, so as to define a first gap between a second chamber and the first chamber, the first gap configured to suppress an amount of contamination passing from the second chamber to the first chamber,
a first stationary structure comprising a third surface, and
a second structure configured to support the patterning device in the first chamber, movable relative to the first stationary structure, and comprising a fourth surface spaced apart from the third surface of the first stationary structure, so as to define a second gap between a third chamber and the second chamber,
wherein the first stationary plate is configured for being located between the reticle stage and an illumination system of a lithographic apparatus and a projection system of the apparatus, the illumination system configured to condition a radiation beam and a projection system configured to project a pattern imparted to the radiation beam by the patterning device onto a substrate.

27. The apparatus of claim 26, wherein the second gap is configured to suppress an amount of contamination passing from the third chamber to the first chamber.

* * * * *